US008810036B2

United States Patent
Min et al.

(10) Patent No.: US 8,810,036 B2
(45) Date of Patent: Aug. 19, 2014

(54) SEMICONDUCTOR DEVICE AND METHOD FORMING PATTERNS WITH SPACED PADS IN TRIM REGION

(75) Inventors: Jin-Ho Min, Yongin-si (KR); Ki-Jeong Kim, Hwaseong-si (KR); Kyoung-Sub Shin, Seongnam-si (KR); Dong-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 13/604,723

(22) Filed: Sep. 6, 2012

(65) Prior Publication Data

US 2013/0105983 A1    May 2, 2013

(30) Foreign Application Priority Data

Oct. 28, 2011    (KR) .................. 10-2011-0111411

(51) Int. Cl.
*H01L 23/52*    (2006.01)
*H01L 23/48*    (2006.01)
*H01L 23/528*   (2006.01)
*H01L 27/32*    (2006.01)

(52) U.S. Cl.
CPC ................... *H01L 27/3276* (2013.01)
USPC ............... 257/773; 257/786; 257/E23.151

(58) Field of Classification Search
CPC .................................... H01L 27/3276
USPC .................... 257/773, 786, E23.151
See application file for complete search history.

(56) References Cited

U.S. PATENT DOCUMENTS

| 7,368,362 | B2 | 5/2008 | Tran et al. | |
| 7,651,950 | B2 * | 1/2010 | Ban ............................... | 438/725 |
| 7,838,996 | B2 * | 11/2010 | Sato et al. ...................... | 257/775 |
| 2009/0263749 | A1 * | 10/2009 | Sim et al. ....................... | 430/319 |
| 2010/0090349 | A1 * | 4/2010 | Park et al. ...................... | 257/773 |
| 2010/0155959 | A1 * | 6/2010 | Park et al. ...................... | 257/773 |
| 2010/0244269 | A1 * | 9/2010 | Kim ............................... | 257/773 |

FOREIGN PATENT DOCUMENTS

KR    1020090044409 A    5/2009

\* cited by examiner

*Primary Examiner* — Luan C Thai
(74) *Attorney, Agent, or Firm* — Volentine & Whitt, PLLC

(57) ABSTRACT

In a semiconductor device, parallel first and second conductive lines having a unit width extend from a memory cell region into a connection region. A trim region in the connection region includes pads respectively connected to the first and second conductive lines but are separated by a width much greater than the unit width.

20 Claims, 37 Drawing Sheets

SEMICONDUCTOR DEVICE AND METHOD FORMING PATTERNS WITH SPACED PADS IN TRIM REGION

CROSS-REFERENCE TO RELATED APPLICATIONS

This application claims the benefit of Korean Patent Application No. 10-2011-0111411 filed on Oct. 28, 2011, the subject matter of which is hereby incorporated by reference.

BACKGROUND

The inventive concept relates to semiconductor devices and methods of manufacture for semiconductor devices. More particularly, the inventive concept relates to semiconductor devices fabricated with high-density patterns having an ultrafine width(s) and gap(s), as well as methods of manufacturing such semiconductor devices.

Contemporary semiconductor devices are very densely integrated with increasing small elements and corresponding layout features. As a result, high-density patterns separated by ultrafine gaps (or widths) are increasingly required. Indeed, contemporary requirements for ultrafine patterning are pushing beyond the resolution limit of conventional photolithography processes. Accordingly, there is an ongoing demand for technology and design improvements capable of forming high-density patterns while remaining within the resolution limits of conventional photolithography processes.

SUMMARY

In various embodiments, the inventive concept provides semiconductor devices including high-density patterns having ultrafine gaps (or widths). In certain embodiments, portions of a high-density pattern used as pads may be formed with sufficient process margin to ensure reliability. Nonetheless, the pads may be formed with a size that is realizable within a resolution limit of available photolithography processes. In various other embodiments, the inventive concept provides methods of manufacturing such semiconductor devices.

According to an aspect of the inventive concept, there is provided a semiconductor device comprising; a substrate comprising a memory cell region, a connection region and a group of conductive lines each having a unit width, being arranged in parallel along a defined center line, including a first conductive line and a second conductive line, and extending in a first direction from the memory cell region into the connection region, wherein the first conductive line has a first length in the first direction extending away from the memory cell region that ends in a first portion extending a second length in a second direction away from the center line, the first portion terminates in a portion bending back in the first direction towards the memory cell region to connect a second portion extending in the second direction away from the center line to connect a first pad, and the second conductive line has a third length less than the first length extending in the first direction away from the memory cell region and ends in a first portion extending a fourth length less than the second length in the second direction away from the center line, the first portion terminates in a portion bending back in the first direction towards the memory cell region to connect a second portion extending in the second direction back towards the center line to connect a second pad, and a width separating the first pad from the second pad is greater than the unit width.

According to an aspect of the inventive concept, there is provided a semiconductor device comprising; a plurality of first conductive lines extending in parallel along a first direction, having a unit width, and being adjacently separated by a gap having the unit width, a plurality of second conductive lines respectively extending from the plurality of first conductive lines in a second direction intersecting the first direction, having the unit width, and being adjacently separated by a gap having the unit width, an extension portion at least partially surrounded by the plurality of second conductive lines, having a width in the second direction greater than the gap having the unit width, and a plurality of pads formed in the extension portion and respectively connected to the plurality of second conductive lines.

According to an aspect of the inventive concept, there is provided a semiconductor device comprising; a substrate comprising a memory cell region, a connection region, and multiple groups of conductive lines arranged in parallel along a defined center line and extending in a first direction from the memory cell region into the connection region, wherein each conductive line in each group of conductive lines has a unit width and is adjacently separated from another conducive line by a gap having the unit width, wherein each group of conductive lines includes a first conductive line and a second conductive line, the first conductive line has a first length in the first direction extending away from the memory cell region that ends in a first portion extending a second length in a second direction away from the center line, the first portion terminates in a portion bending back in the first direction towards the memory cell region to connect a second portion extending in the second direction away from the center line to connect a first pad, the second conductive line has a third length less than the first length extending in the first direction away from the memory cell region and ends in a first portion extending a fourth length less than the second length in the second direction away from the center line, the first portion terminates in a portion bending back in the first direction towards the memory cell region to connect a second portion extending in the second direction back towards the center line to connect a second pad, and a width separating the first pad from the second pad is greater than the unit width.

In the aspects described above, the unit width may be less than a minimum width realizable by photolithography equipment used to form a group of conductive lines, or used to form the conductive lines in the groups of conductive lines.

BRIEF DESCRIPTION OF THE DRAWINGS

Certain embodiments of the inventive concept will be more clearly understood from the following description taken in conjunction with the accompanying drawings in which.

DETAILED DESCRIPTION

Figure 1:
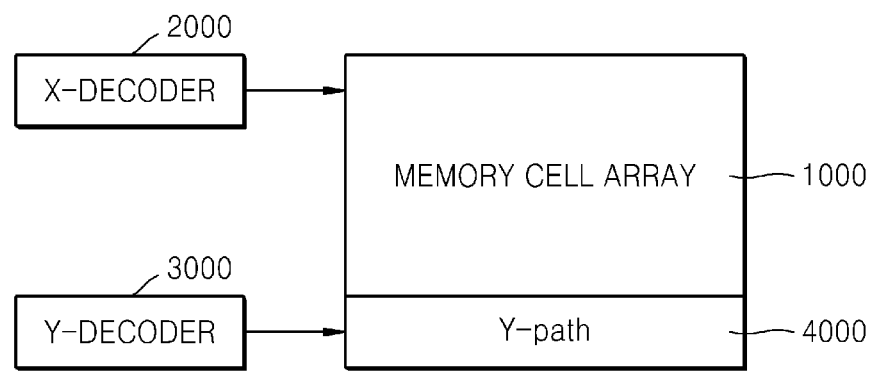
FIG. 1 is a block diagram of a memory device according to an embodiment of the inventive concept.

The inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the inventive concept to those of ordinary skill in the art.

Throughout the specification, it will also be understood that when an element such as layer, region, or substrate is referred to as being "on", "connected to" or "coupled with" another element, it can be directly on the other element, or intervening elements may also be present. In the drawings, the thicknesses of layers and regions are exaggerated for clarity. Throughout the drawings and written description, like reference numbers and labels are used to denote like or similar elements. Furthermore, all examples and conditional language recited herein are to be construed as being without limitation to such specifically recited examples and conditions.

Expressions such as "at least one of," when preceding a list of elements, modify the entire list of elements and do not modify the individual elements of the list.

Figure 2:
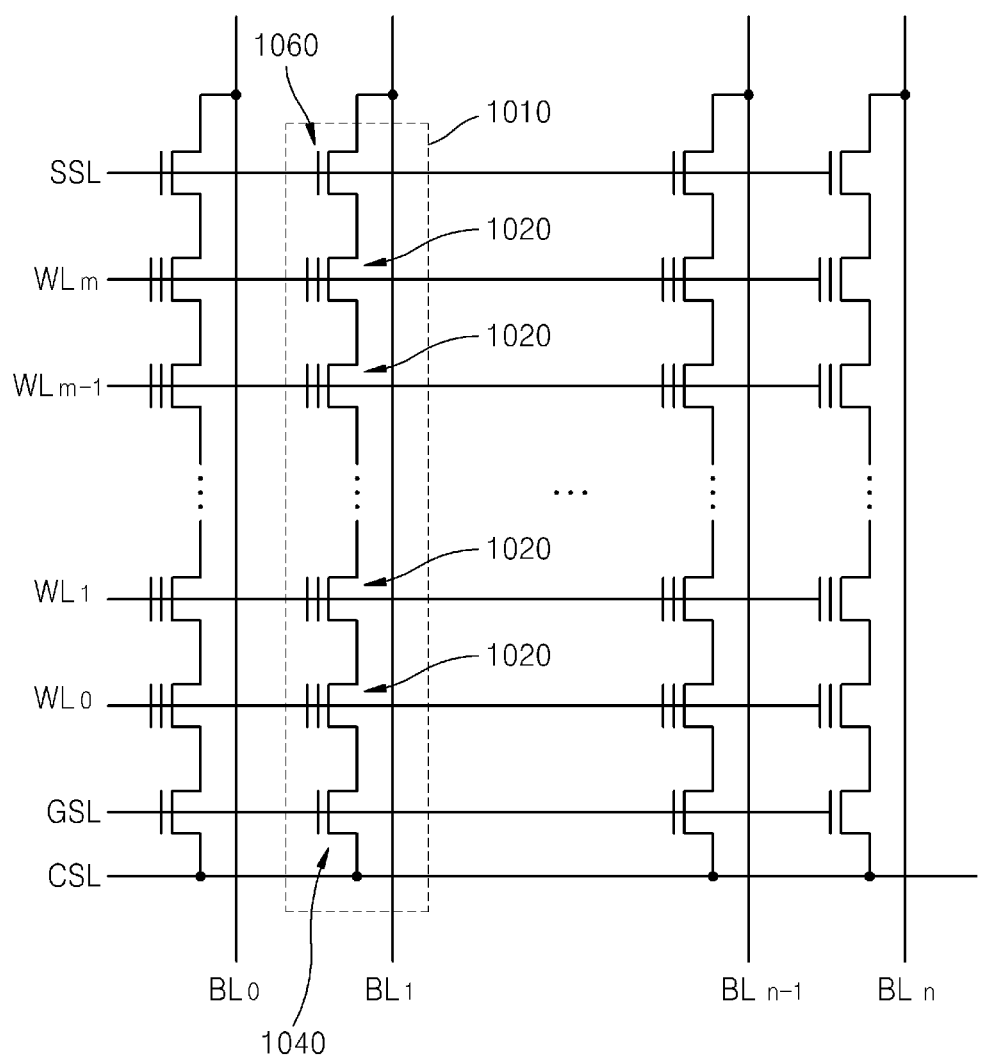
FIG. 2 is a circuit diagram of a memory cell array included in the memory device of FIG. 1.

Figure (FIG.) 1 is a block diagram of a memory device according to an embodiment of the inventive concept. FIG. 2 is a circuit diagram of a memory cell array 1000 included in the memory device of FIG. 1.

Referring to FIG. 1, the memory device such as an NAND flash memory device or the like includes the memory cell array 1000, an X-decoder block 2000, a Y-decoder block 3000, and a Y-path circuit 4000.

The memory cell array 1000 may be formed of an array in which memory cells are densely arrayed. The memory cell array 1000 may have an array structure as shown in FIG. 2.

The X-decoder block 2000 is a peripheral circuit for accessing and driving the memory cell array 1000, and functions to select wordlines WL, e.g., wordlines $WL_0$, $WL_1, \ldots, WL_{m-1}, WL_m$, of the memory cell array 1000 which are to be accessed.

The Y-decoder block 3000 selects bit lines BL, e.g., $BL_0$, $BL_1, \ldots, BL_{m-1}, BL_m$, of the memory cell array 1000 which are to be activated.

The Y-path circuit 4000 is connected to the memory cell array 1000, and functions to allocate a bit line path according to an output from the Y-decoder block 3000.

Referring to FIG. 2, the memory cell array 1000 may include a plurality of cell strings 1010. Each of the cell strings 1010 may include a plurality of memory cells 1020 that are connected in series. Gate electrodes of the memory cells 1020 included in one cell string 1010 may be connected to corresponding wordlines $WL_0$, $WL_1, \ldots, WL_{m-1}, WL_m$, respectively.

Also, a ground selecting transistor 1040 to be connected to a ground selection line GSL, and a string selecting transistor 1060 to be connected to a string selection line SSL may be disposed at ends of each cell string 1010, respectively. The string selecting transistor 1060 and the ground selecting transistor 1040 control electrical connection among the memory cells 1020, the bit lines BL, e.g., $BL_0$, $BL_1, \ldots, BL_{m-1}, BL_m$, and a common source line CSL. The memory cells 1020 that are connected to one wordline in the cell strings 1010 may form a page unit or a byte unit.

In order to perform a read operation or a write operation by selecting a predetermined memory cell in the memory device of FIG. 1, the wordlines $WL_0$, $WL_1, \ldots, WL_{m-1}, WL_m$ and the bit lines BL, e.g., $BL_0$, $BL_1, \ldots, BL_{m-1}, BL_m$ of the memory cell array 1000 are selected by using the X-decoder block 2000 and the Y-decoder block 3000.

A NAND flash memory device has a structure in which a plurality of memory cells are connected in series, and thus, has relatively high integration. However, recently, it is required to further decrease the design rule for NAND flash memory device so as to shrink the overall size of the constituent semiconductor chip. Also, due to the decrease of the design rule, the minimum "pitch" (or spacing) of patterns required to form the NAND flash memory device has been significantly reduced. One or more embodiments of the inventive concept provide a semiconductor device comprising a ultrafine conductive line and a pad nonetheless having a sufficient process margin. These features may be embodied using patterns having a size that is realizable within the resolution limits of available exposure equipment and expositing techniques according to available photolithography technology.

Figure 3:
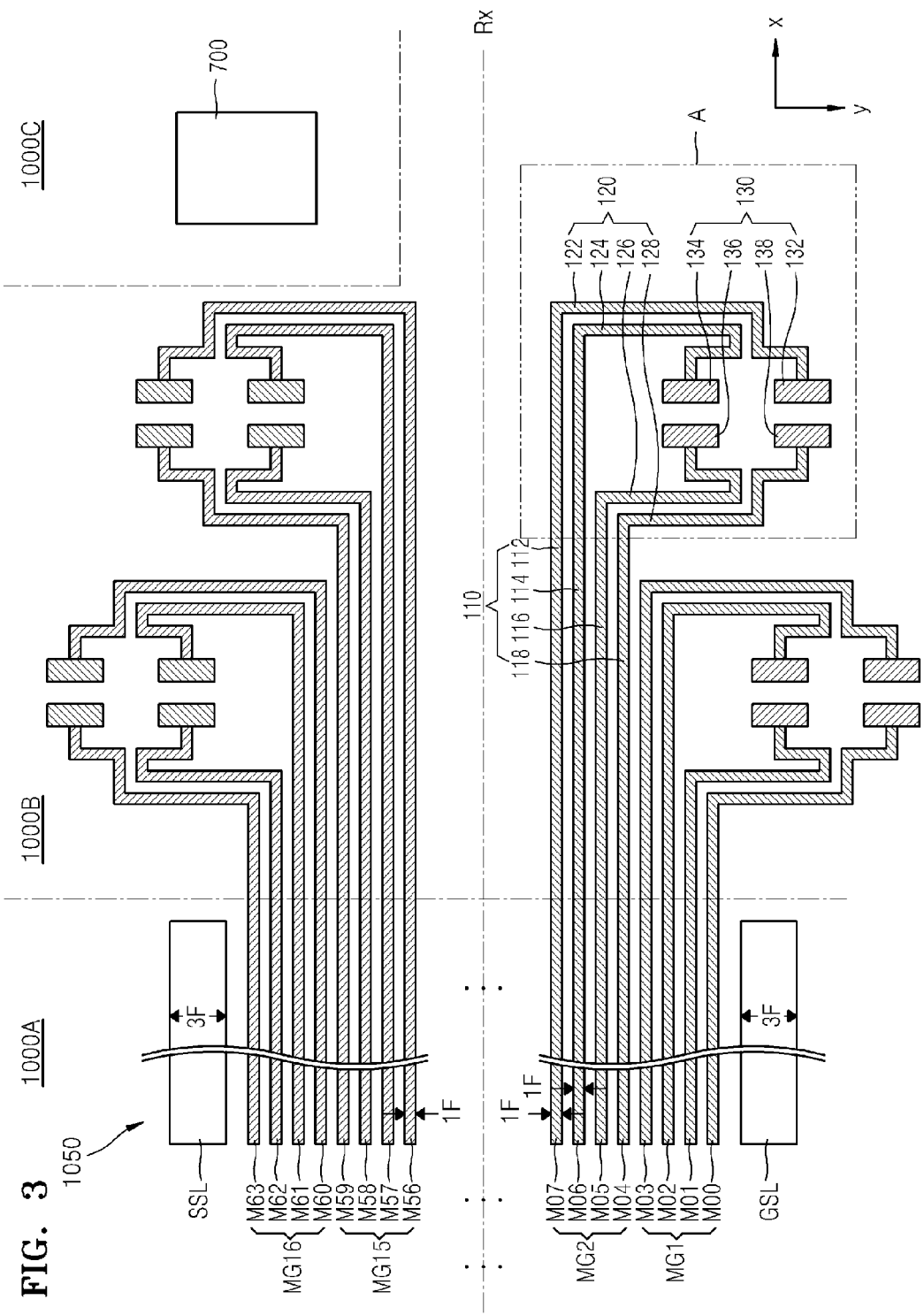
FIG. 3 is a plane view illustrating a cavity structure of a semiconductor device, according to an embodiment of the inventive concept.

FIG. 3 is a plane view illustrating a cavity structure of a semiconductor device, according to an embodiment of the inventive concept.

The plane view provide by FIG. 3 illustrates a portion of a semiconductor device structure that may be embodied by methods of manufacture according to certain embodiments of the inventive concept. FIG. 3 illustrates a portion of a memory cell region 1000A of a NAND flash memory device, a portion of a connection region 1000B for connecting a plurality of conductive lines such as a plurality of word lines or a plurality of bit lines that form the memory cell array of the memory cell region 1000A with various external circuit(s) (not shown), and a portion of a peripheral circuit region 1000C.

Referring to FIG. 3, the connection region 1000B of the semiconductor device includes a first conductive line unit 110, a second conductive line unit 120, and a pad unit 130 respectively formed on a substrate, where the memory cell region 1000A, connection region 1000B, and peripheral circuit region 1000C are variously defined (or laid out) on the substrate. A plurality of memory cell blocks 1050 may be formed in the memory cell region 1000A, however for convenience of description, FIG. 3 illustrates only one memory cell block 1050.

The substrate may be formed as a semiconductor substrate including a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The substrate may include a bulk wafer or an epitaxial layer. On the substrate, active regions, isolation layers, conductive layers, and insulating layers may be formed.

The first conductive line unit 110 may include a plurality of conductive lines M00, M01, M02, ..., M61, M62, M63 between an string selection line SSL and a ground selection line GSL disposed in the memory cell block 1050. The conductive lines M00, M01, M02, ..., M61, M62, M63 of the first conductive line unit 110 may extend in parallel to each other from the memory cell region 1000A to the connection region 1000B in a first direction (i.e., an X-axis direction), and may have a width and gap of 1 F that is a minimum feature size. Each of the conductive lines M00, M01, M02, . . . , M61, M62, M63 may be electrically connected to the external circuit such as a decoder via the second conductive line unit 120 and the pad unit 130 that are formed in the connection region 1000B.

The conductive lines M00, M01, M02, . . . , M61, M62, M63 may be grouped into a plurality of conductive line groups MG1, MG2, . . . , MG15, MG16 that each include four first conductive lines 112, 114, 116, and 118. For convenience of description, FIG. 3 illustrates that the first conductive line unit 110 includes the four first conductive lines 112, 114, 116, and 118 of only one conductive line group, e.g., the conductive line group MG2.

The second conductive line unit 120 may include a plurality of conductive lines that extend from the conductive lines M00, M01, M02, . . . , M61, M62, M63 of the first conductive line unit 110, respectively, in a second direction (i.e., a Y-axis direction) in the connection region 1000B. The conductive lines of the second conductive line unit 120 may be grouped into the plurality of conductive line groups MG1, MG2, . . . , MG15, MG16 that each include four second conductive lines 122, 124, 126, and 128, respectively. For convenience of description, FIG. 3 illustrates that the second conductive line unit 120 includes only the four second conductive lines 122, 124, 126, and 128 of the conductive line group MG2.

The second conductive lines 122, 124, 126, and 128 of the second conductive line unit 120 may be integrally formed with the first conductive lines 112, 114, 116, and 118 of the first conductive line unit 110, respectively, and each of the second conductive lines 122, 124, 126, and 128 may have a width of 1 F.

The pad unit 130 may include a plurality of pads that are respectively connected to the conductive lines of the second conductive line unit 120 in the connection region 1000B. The pads of the pad unit 130 may be grouped into the plurality of conductive line groups MG1, MG2, . . . , MG15, MG16 that each include four pads 132, 134, 136, and 138, respectively. For convenience of description, FIG. 3 illustrates the pad unit 130 including only the four pads 132, 134, 136, and 138 of "associated with" (i.e., "respectively connected to", or "integrally formed in a conductive manner with") the conductive lines of the conductive line group MG2.

Hence, the pads 132, 134, 136, and 138 of the pad unit 130 may be integrally formed with the second conductive lines 122, 124, 126, and 128 of the second conductive line unit 120, respectively. Although the pads 132, 134, 136, and 138 of the pad unit 130 are formed at the respective ends of the second conductive lines 122, 124, 126, and 128 of the second conductive line unit 120, the present embodiment is not limited thereto, and the pads 132, 134, 136, and 138 of the pad unit 130 may be disposed at various positions along the second conductive lines 122, 124, 126, and 128. This positioning will be described in detail with reference to FIGS. 20 through 23.

Each of the conductive line groups MG1, MG2, . . . , MG15, MG16 may include the four first conductive lines 112, 114, 116, and 118, the four second conductive lines 122, 124, 126, and 128, and the four pads 132, 134, 136, and 138. Also, as illustrated in FIG. 3, in each of the conductive line groups MG1, MG2, . . . , MG15, MG16, structures of the second conductive lines 122, 124, 126, and 128 may be the same one another, and structures of the four pads 132, 134, 136, and 138 may be the same.

The conductive line groups MG1, MG2, . . . , MG15, MG16 may be formed to be symmetrical with each other in the second direction (the Y-axis direction) about a center line Rx extending along an arbitrarily defined central portion of the substrate in the first direction. Also, lengths of the conductive lines M00, M01, M02, . . . , M61, M62, M63 in the first direction may sequentially decrease along the second direction with respect to the center line Rx. That is, the length of a conductive line along the first direction and closest to the center line Rx may be the longest, and the corresponding lengths of the conductive lines may decrease as they are disposed father from the center line Rx. The different lengths may also be described as a case in which lengths of the conductive line groups MG1, MG2, . . . , MG15, MG16 in the first direction sequentially decrease along the second direction with respect to the center line Rx.

Referring to FIG. 3, one memory cell block 1050 includes 16 conductive line groups MG1, MG2, . . . , MG15, MG16. However, embodiments of the inventive concept are not limited thereto. That is, the number of conductive line groups included in one memory cell block 1050 is not limited to some arbitrary number of conductive line groups.

Each of the string selection line SSL and the ground selection line GSL may have a width of 3 F that is greater than a width 1 F of the conductive lines M00, M01, M02, . . . , M61, M62, M63. Also, a gap of 1 F may be remained between the outermost conductive line M00 and the ground selection line GSL, and between the outermost conductive line M63 and the string selection line SSL, respectively.

A conductive pattern 700 may be formed in the peripheral circuit region 1000C.

The first conductive line unit 110, i.e., the conductive line groups MG1, MG2, . . . , MG15, MG16, the string selection line SSL, the ground selection line GSL, the second conductive line unit 120, the pad unit 130, and the conductive pattern for the peripheral circuit 700 may be formed of the same material.

In the illustrated embodiment of FIG. 3, the conductive lines M00, M01, M02, . . . , M61, M62, M63 may be word lines connected with a plurality of memory cells in the memory cell region 1000A. In another embodiment, the conductive lines M00, M01, M02, . . . , M61, M62, M63 may be bit lines connected to the plurality of memory cells in the memory cell region 1000A. In this case, the string selection line SSL and the ground selection line GSL may be omitted. The conductive pattern for the peripheral circuit 700 may form a gate electrode of a transistor of a peripheral circuit.

The aforementioned descriptions are related to the NAND flash memory device. However, semiconductor devices manufactured according to embodiments of the inventive concept are not limited thereto, and may be applied to all types of semiconductor devices including a dynamic random access memory (DRAM) memory device, a logic device, or the like having a structure in which a plurality of conductive lines are disposed and pads are formed at ends.

Hereinafter, various structures for the first conductive line unit 110, the second conductive line unit 120, and the pad unit 130 will be described in some additional detail with reference to FIG. 4.

Figure 4:
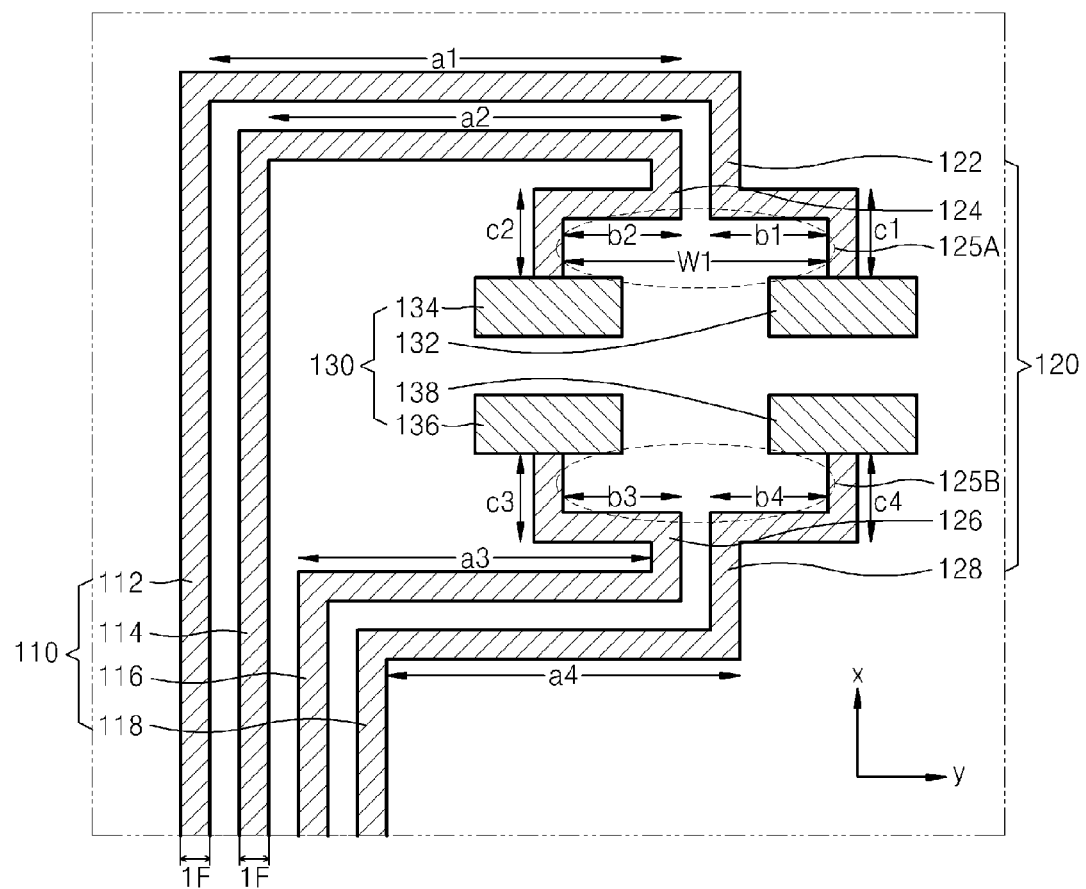
FIG. 4 is a magnified plane view illustrating a portion A of FIG. 3.

FIG. 4 is a magnified plane view further illustrating the portion "A" identified in FIG. 3 and shows the terminal ends of certain ones of the conductive line groups MG1, MG2, . . . , MG15, MG16. In this context, the term "terminal end" refers to a position along a conductive line of the conductive line group at which a pad is disposed. This position is generally more distal from the memory cell block 1050, but need not be the absolute physical end of the conductive line.

Thus, as one example, FIG. 4 further illustrates the terminal ends of the conductive lines M04, M05, M06 and M07 in the conductive line group MG2.

Referring to FIG. 4, the conductive line group MG2 is shown with the first conductive line unit 110, the second conductive line unit 120, and the pad unit 130.

The first conductive line unit 110 includes four (4) conductive lines, e.g., the first conductive lines 112, 114, 116, and 118 that extend in parallel to each other from the memory cell region 1000A to the connection region 1000B of FIG. 3 in the first direction. Each of the first conductive lines 112, 114, 116, and 118 has a width of 1 F, and is separated by a gap of 1 F as regularly arranged among the neighboring first conductive lines 112, 114, 116, and 118.

In the illustrated example, the lengths of the first conductive lines 112, 114, 116, and 118 in the first direction decreased as the respective conductive lines are disposed farther from a defined layout center line Rx. Thus, the first conductive line 112 has the longest length, the first conductive line 114 has the second longest length, the first conductive line 116 has the third longest length, and the first conductive line 118 has the shortest length.

The second conductive line unit 120 may include second conductive lines 122, 124, 126, and 128, and two extension portions 125A and 125B. The second conductive lines 122, 124, 126, and 128 may extend from the first conductive lines 112, 114, 116, and 118, respectively, in the second direction, and each of the second conductive lines 122, 124, 126, and 128 may have a width of 1 F.

According to the illustrated embodiment of FIG. 4, the second conductive lines 122, 124, 126, and 128 extend orthogonally from the first conductive lines 112, 114, 116, and 118, respectively, in the second direction, but they are not limited thereto, and may extend from the first conductive lines 112, 114, 116, and 118, respectively, at a predetermined angle.

In some additional detail, the second conductive lines 122, 124, 126, and 128 may have first portions a1, a2, a3, and a4 that extend from ends of the first conductive lines 112, 114, 116, and 118, respectively, in the second direction. Also, the second conductive lines 122, 124, 126, and 128 may have second portions b1, b2, b3, and b4 that extend from the first portions a1, a2, a3, and a4, respectively, and to approach in a separated manner the extension portions 125A and 125B.

Thus, adjacent second portions extend away from each other in the second direction approaching the extension portions to effectively separate the extension portions that extend in the first direction. For example, adjacent second portions b1 and b2 extend away from each other as they approach one side of the first extension portion 125A, while the second portions b3 and b4 extend away from each other as they approach one side of the second extension portion 125B. However, the adjacent second portions may extend not in an opposite direction but they have a predetermined angle with respect to each other in the extension portions.

In addition, the second portions b1, b2, b3, and b4 may have bending portions c1, c2, c3, and c4 formed at their ends, respectively. For example, the bending portions c1 and c2 of the second portions b1 and b2 effectively approach (or "surround") both side surfaces of the extension portion 125A and the bending portions c3 and c4 of the second portions b3 and b4 surround both side surfaces of the extension portion 125B. However, the bending portions c1, c2, c3, and c4 may surround the portions of the extension portions 125A and 125B in a way different from the present embodiment, or the bending portions c1, c2, c3, and c4 may not be formed.

The width in the second direction of each of the extension portions 125A and 125B may therefore be larger than the gap separating adjacent first portions. For example, a width W1 for the first extension portion 125A, (i.e., a distance between the adjacent bending portions c1 and c2) may be larger than the 1 F gap between the adjacent first portions a1 and a2. The width W1 in the second direction for each of the extension portions 125A and 125B may be changed by adjusting a buffer photoresist (PR) pattern (e.g., the structure of a second PR pattern 600-2 later described with reference to FIG. 9A) during manufacture of the semiconductor device. This change will be described in some additional detail hereafter with reference to FIGS. 5A through 18B.

The extension portions 125A and 125B may have structures that are symmetrical to each other about a trim region. The trim region is a region in which two neighbouring second conductive lines are electrically open with respect to other two neighbouring second conductive lines, and may indicate a portion TA in FIG. 14A, and FIGS. 20 through 23. However, a defined trim region for certain embodiments of the inventive concept is not limited to the portion TA set forth in the illustrated examples.

The pad unit 130 of FIG. 4 includes the four pads 132, 134, 136, and 138 that are connected at terminal ends of the second conductive lines 122, 124, 126, and 128, (e.g., the ends of the bending portions c1, c2, c3, and c4). Each of the four pads 132, 134, 136, and 138 may have a rectangular-shape structure, a width in the first direction and/or the second direction may be larger than 1 F. The four pads 132, 134, 136, and 138 may be separated from each other by a predetermined distance. The widths in the first and second directions of each of the four pads 132, 134, 136, and 138, and a gap between the four pads 132, 134, 136, and 138 may be changed by adjusting a pad PR pattern, (e.g., a structure of a fourth PR pattern later described with reference to FIG. 16A) during the manufacture of the semiconductor device, and the pad PR pattern may be adjusted to provide sufficient process margin in accordance with the design of the extension portions 125A and 125B. This adjustment will be described in some additional detail with reference to FIGS. 5A through 18B.

In the semiconductor device according to the present embodiment, the first conductive line unit 110, the second conductive line unit 120, and the pad unit 130 may be simultaneously formed by applying a Double Patterning Technology (DPT) process to a mask pattern that has a predetermined shape and is a realizable by the existing lithography technology. Also, since the extension portions 125A and 125B are arranged in the second conductive line unit 120, the pad unit 130 may be easily formed with a sufficient process margin. However, the structures of the second conductive line unit 120 and the pad unit 130 are not limited to the present embodiment and thus may vary. That is, all semiconductor devices in which a second conductive line unit includes extension portions, and a pad unit is formed by using the extension portions may be belonged to the inventive concept.

FIGS. 5A through 18B are plane views and cross-sectional views illustrating a semiconductor device pattern forming procedure of FIG. 4, according to an embodiment of the inventive concept. Here, FIGS. 5A, 6A, 7A, 8A, 9A, 10A, 11A, 12A, 13A, 14A, 15A, 16A, 17A, and 18A are plane views regarding steps of the semiconductor device pattern forming procedure according to the present embodiment, and FIGS. 5B, 6B, 7B, 8B, 9B, 10B, 11B, 12B, 13B, 14B, 15B, 16B, 17B, and 18B are cross-sectional views of FIGS. 5A, 6A, 7A, 8A, 9A, 10A, 11A, 12A, 13A, 14A, 15A, 16A, 17A, and 18A, respectively, taken along lines I-I'.

Figure 5A:
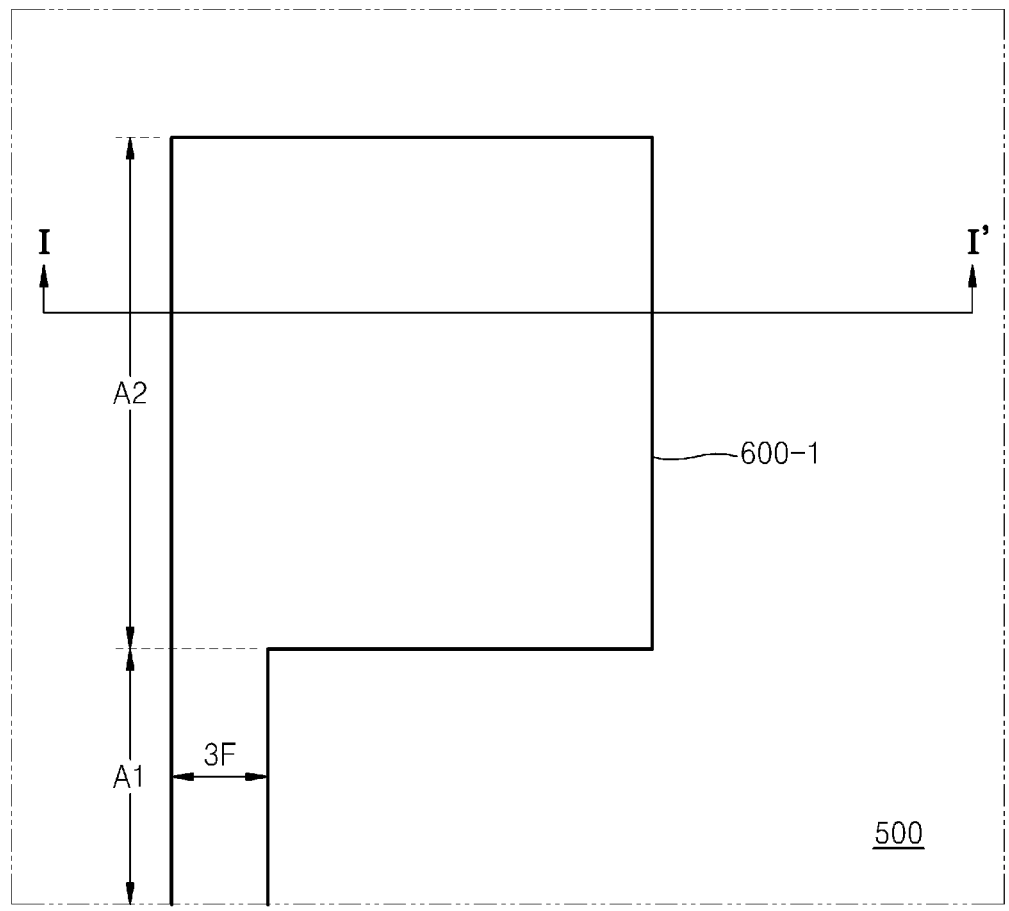
FIGS. 5A through 18B are plane views and cross-sectional views illustrating a semiconductor device pattern forming procedure of FIG. 4, according to an embodiment of the inventive concept.
Figure 5B:
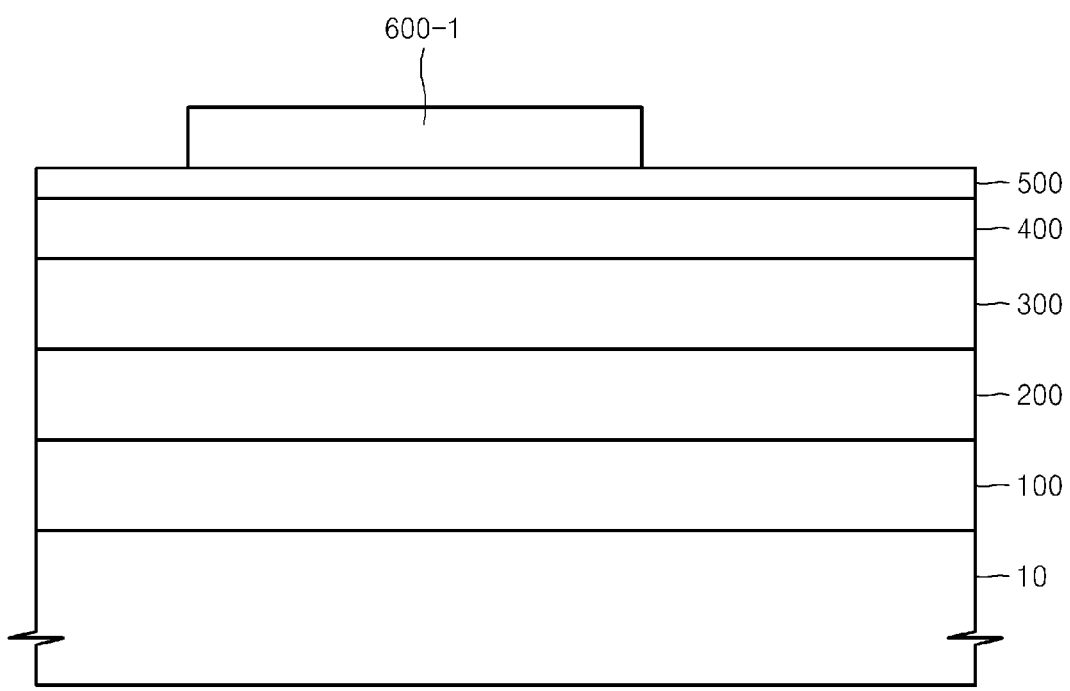

Referring to FIGS. 5A and 5B, a target layer 100, a mask layer 200, a first sacrificial layer 300, a second sacrificial layer 400, and an anti-reflection layer (ARL) 500 are formed on a substrate 10, and a first PR pattern 600-1 having a predetermined shape is formed on the ARL 500.

The substrate 10 may be formed of a semiconductor substrate including a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The substrate 10 may include a bulk wafer or an epitaxial layer The memory cell region 1000A, the connection region 1000B, and the peripheral circuit region 1000C may be defined on the substrate 10. FIGS. 5A and 5B illustrate only a portion of the memory cell region 1000A, and a portion of the connection region 1000B. On the substrate 10, active regions, isolation layers, conductive layers, and insulating layers may be formed. For example, a gate electrode (not shown) connected to a wordline may be formed on the substrate 10.

The target layer 100 is a layer on which a target conductive line or pad is formed, and may be formed of doped polysilicon, metal, metal nitride, or a composition thereof. For example, if the target layer 100 is formed as a wordline, the target layer 100 may include a conductive material selected from the group consisting of TaN, TiN, W, WN, HfN, tungsten silicide, polysilicon, and a composition thereof. Alternatively, if the target layer 100 is formed as a bit line, the target layer 100 may include doped polysilicon or metal.

The mask layer 200 may be formed of a material having an etching characteristic different from the target layer 100 in a predetermined etching condition. For example, the mask layer 200 may be formed as an oxide layer including $SiO_2$. A target pattern to be formed on the target layer 100 is formed in the mask layer 200, and then the target pattern formed in the mask layer 200 is transferred to the target layer 100, so that the target pattern is formed in the target layer 100.

The first sacrificial layer 300 may be formed of a material having an etching characteristic different from the mask layer 200 in a predetermined etching condition. For example, the first sacrificial layer 300 may be formed of polysilicon or an amorphous carbon layer (ACL). Instead of the ACL, SOH may be used. Here, SOH indicates a material including a hydrocarbon compound in which a carbon portion is about 85-99% of a total weight, or derivatives thereof.

The second sacrificial layer 400 may be formed of a material having an etching characteristic different from the first sacrificial layer 300 in a predetermined etching condition. For example, if the first sacrificial layer 300 is formed of polysilicon, the second sacrificial layer 400 may be formed of ACL or SOH. Conversely, if the first sacrificial layer 300 is formed of ACL or SOH, the second sacrificial layer 400 may be formed of polysilicon.

The ARL 500 has an anti-reflection function during a photolithography process, and may be formed as a single layer or a plurality of layers. If the ARL 500 is formed as the single layer, the ARL 500 may be formed as a SiON layer. If the ARL 500 is formed as a plurality of layers, the ARL 500 may include a bottom anti-reflective coating (BARC) layer (not shown) on the SiON layer.

The first PR pattern 600-1 is formed on the ARL 500 in a predetermined shape via the photolithography process, and a plurality of the first PR patterns 600-1 may be formed. As illustrated in FIG. 5A, each of the first PR patterns 600-1 may be formed according to a predetermined standard and may form a basic structure of a cell region, thus, the first PR pattern 600-1 may be referred to as 'cell PR pattern'.

That is, each first PR pattern 600-1 may include a first region A1 that extends in the first direction and that has a width in the second direction that is 3 F, and a second region A2 that extends from the first region A1 in the first direction and that has a width in the second direction that is greater than 3 F. However, the width of the second region A2 in the second direction is not fixed and may have a predetermined value, in consideration of a second conductive line unit and a pad unit that are to be subsequently formed. Also, a width of the second region A2 in the first direction may have a predetermined value, in consideration of the second conductive line unit and the pad unit. Left surfaces (or first side pattern edges) of the first region A1 and the second region A2 may form the same plane.

Figure 6A:
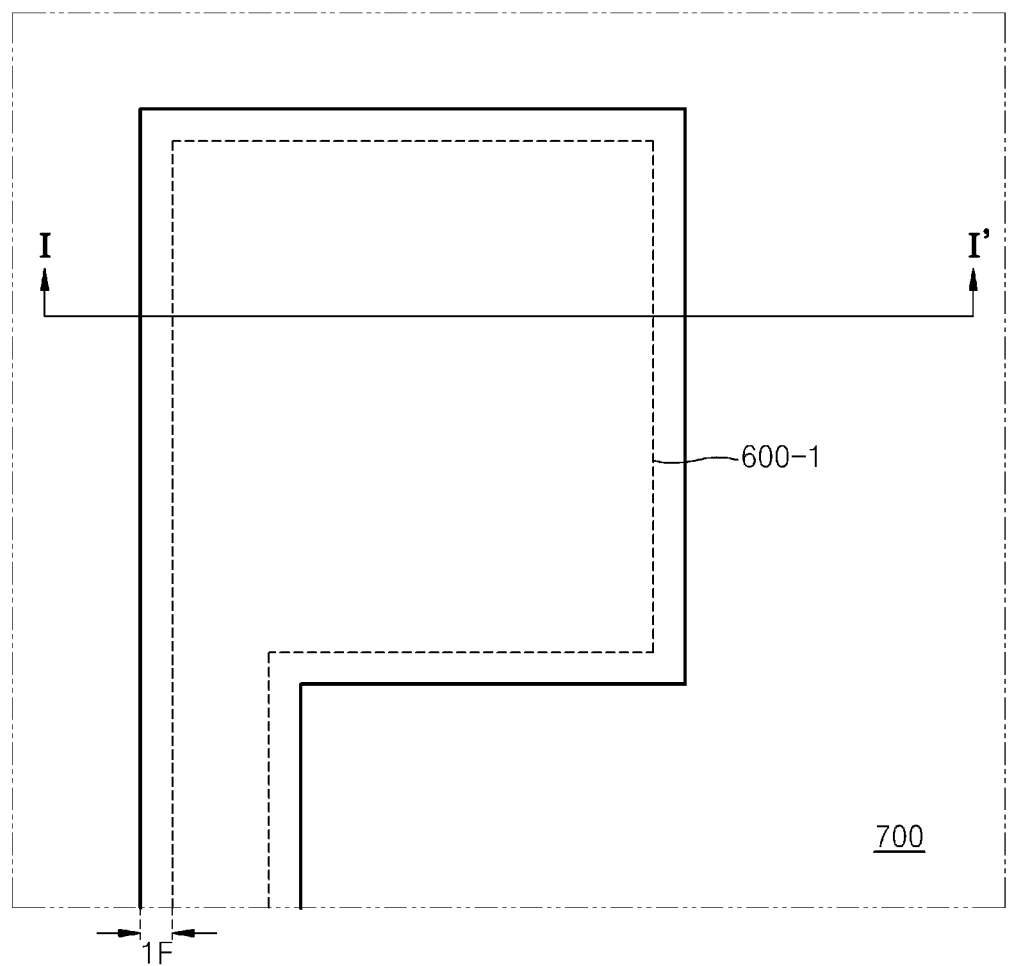
Figure 6B:
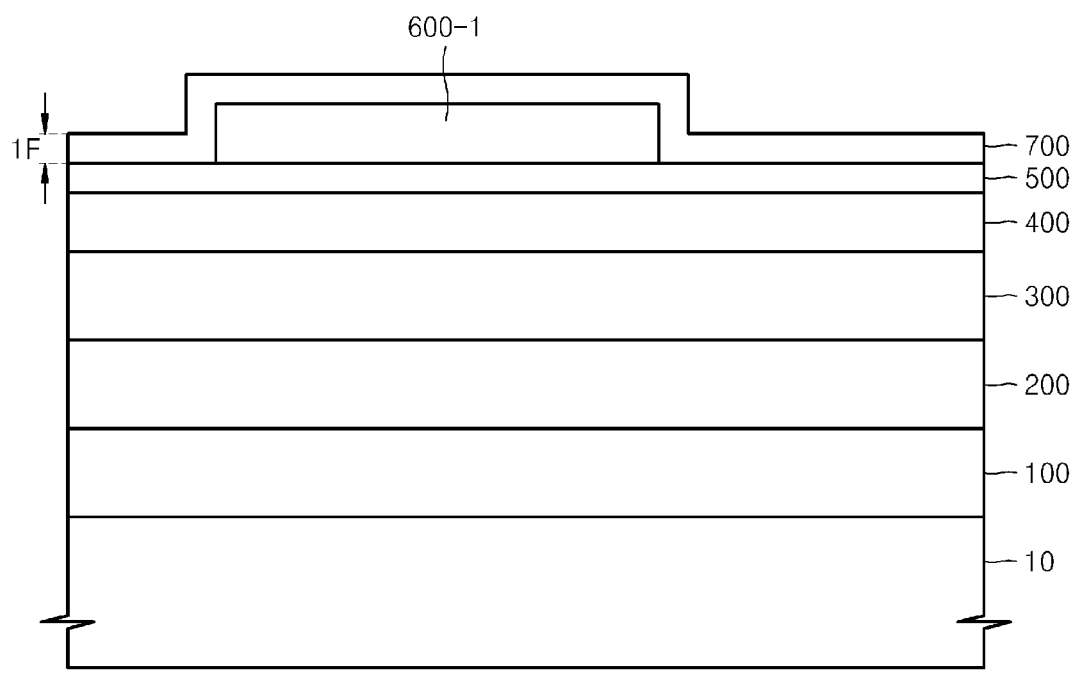

Referring to FIGS. 6A and 6B, a first spacer layer 700 is formed on the first PR pattern 600-1 and the ARL 500. The first spacer layer 700 may have a uniform thickness, for example, the first spacer layer 700 may have the same thickness as a target width (e.g., 1 F). Also, the first spacer layer 700 may be formed of a material having a different etch selectivity to the first PR pattern 600-1. For example, the first spacer layer 700 may be formed as an oxide layer including medium temperature oxide (MTO).

So that the first spacer layer 700 has a uniform thickness, an atomic layer deposition (ALD) process may be used. In particular, when the first spacer layer 700 is formed by performing the ALD process, a temperature of the ALD process may be set as room temperature or a temperature equal to or less than about 75° C. Since the first spacer layer 700 is formed by performing the ALD process, the first spacer layer 700 may be referred to as 'first ALD layer'.

Figure 7A:
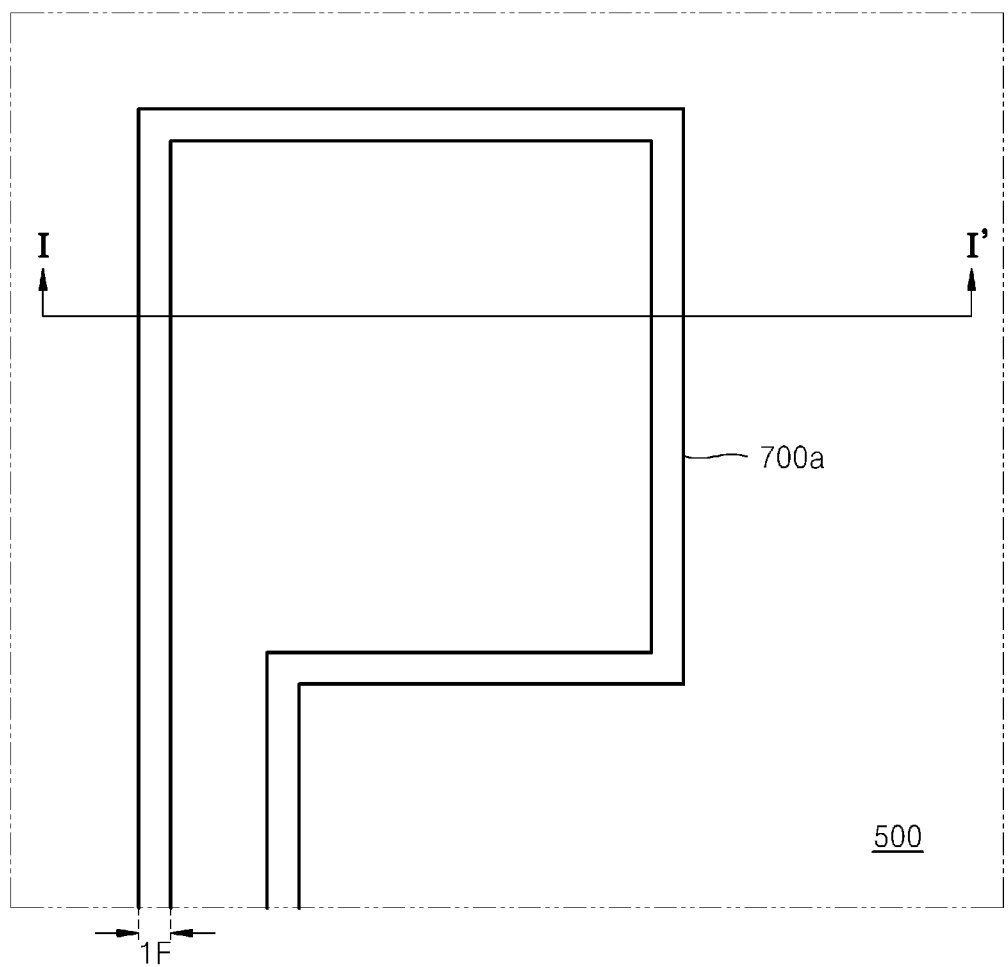
Figure 7B:
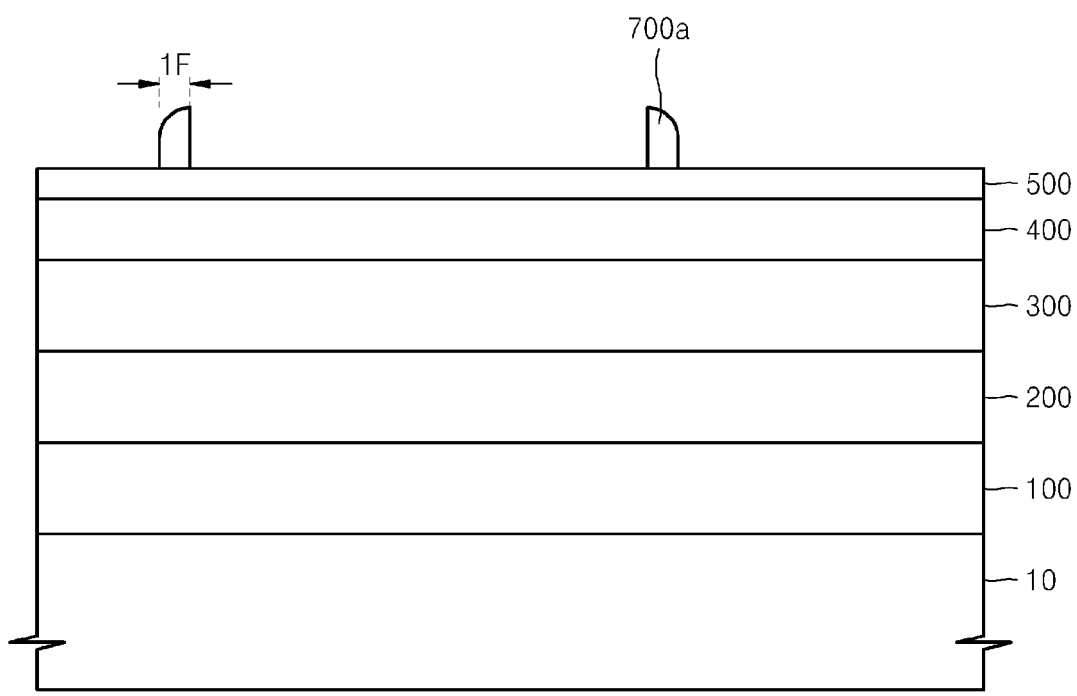

Referring to FIGS. 7A and 7B, an etch-back operation or a dry etching operation is performed on the first spacer layer 700 until a top surface of the ARL 500 is exposed, so that a first spacer 700a covering at least the first side pattern edge and (opposing) second side pattern edge the first PR pattern 600-1 is formed.

As illustrated in FIG. 7A, the first spacer 700a may overlay an "peripheral edge" of the first PR pattern 600-1. Also, as illustrated in FIG. 7B, the first spacer 700a may cover the top surface of the ARL 500 by as much as the target width of 1 F.

In order to etch the first spacer layer 700, a $C_xF_y$ gas (where, each of x and y is an integer between 1 through 10) or a $CH_xF_y$ gas (where, each of x and y is an integer between 1 through 10) may be used as a main etching gas. Also, at least one of an $O_2$ gas and Ar may be used after being mixed with the main etching gas. The $C_xF_y$ gas may include C3F6, C4F6, C4F8, or C5F8. The $CH_xF_y$ gas may include CHF3 or CH2F2. Here, $O_2$ gas added to the main etching gas functions to remove a polymer by-product generated during an etching process and to decompose the $C_xF_y$ gas. Also, Ar gas added to the main etching gas is used as a carrier gas and functions to promote ion bombarding.

When the first spacer layer 700 is etched, plasma of an etching gas selected from the aforementioned etching gases may be generated in an etching chamber, and etching may be performed in the plasma atmosphere. Alternatively, the etching may be performed in an etching gas atmosphere without ion energy by not generating the plasma in the etching chamber. For example, in order to etch the first spacer layer 700, a mixed gas including C4F6, CHF3, $O_2$, and Ar may be used as an etching gas. In this case, a dry etching process using plasma may be performed for several seconds to several tens of seconds at a pressure of about 30 mT while each of C4F6, CHF3, $O_2$, and Ar is supplied to make a volume ratio of C4F6:CHF3:$O_2$:Ar be 1:6:2:14.

After the first spacer 700a is formed, the first PR pattern 600-1 is removed so that only the first spacer 700a is left on the ARL 500. The first PR pattern 600-1 may be removed via an ashing and/or strip process. Also, according to a material forming the ARL 500, the first PR pattern 600-1 may be removed via a dry or wet etching process.

Figure 8A:
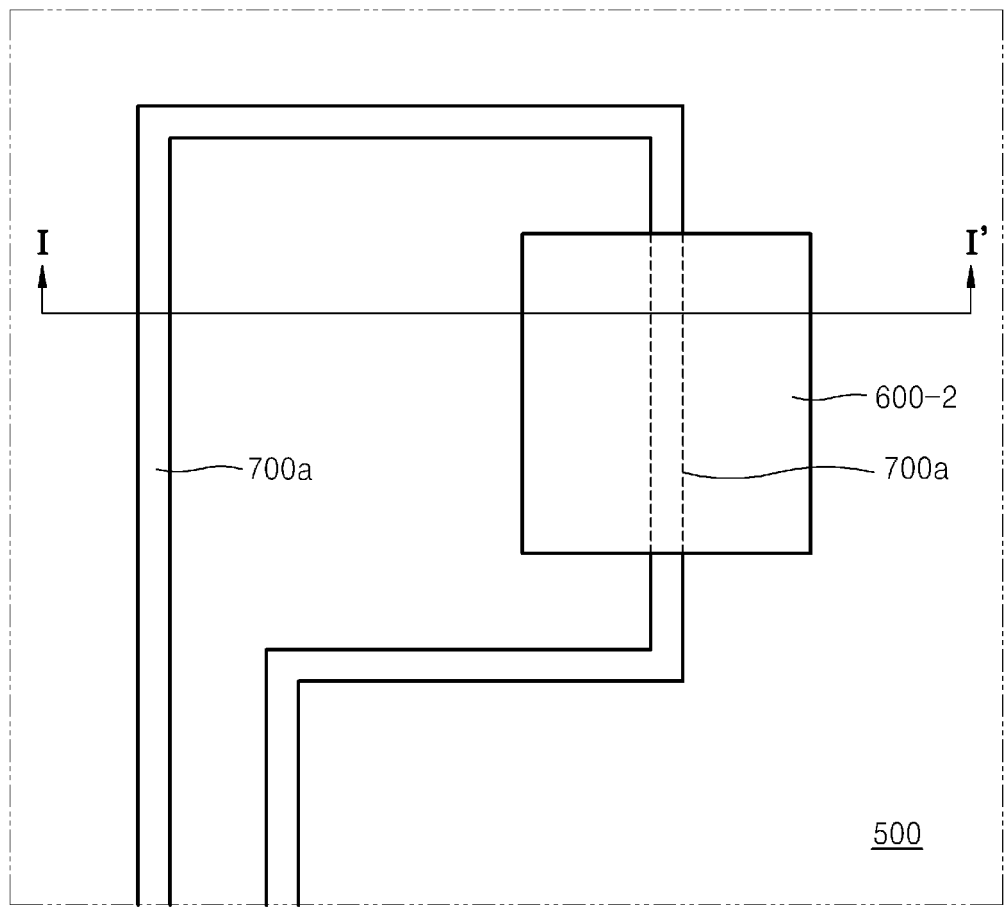
Figure 8B:
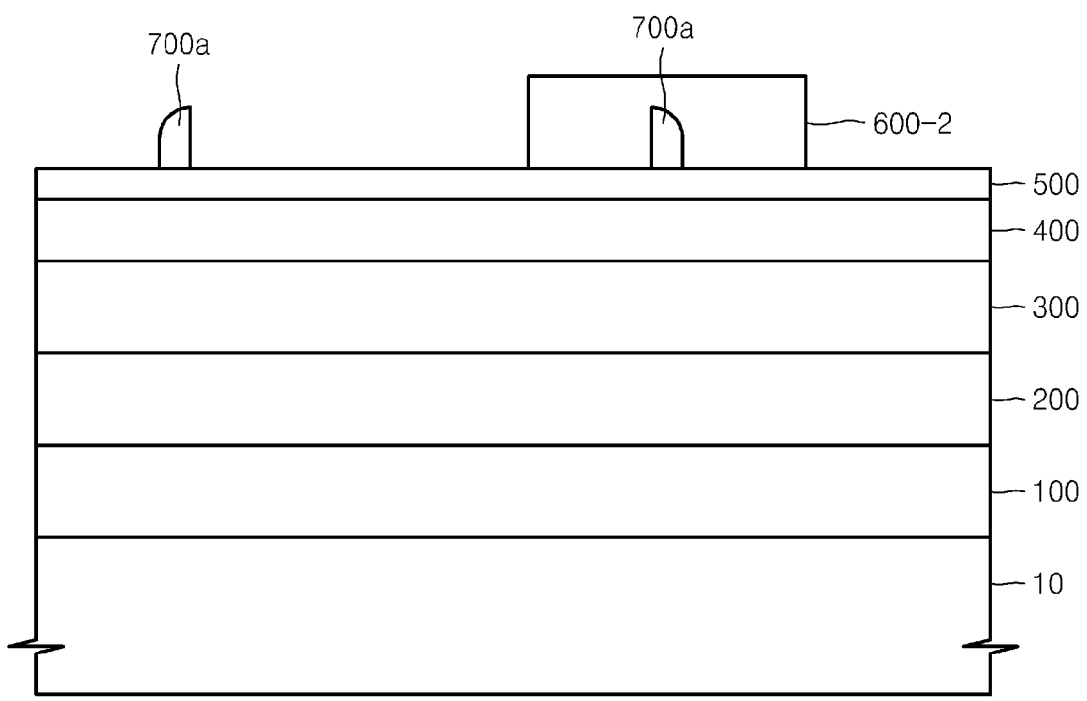

Referring to FIGS. 8A and 8B, after the first PR pattern 600-1 is removed, a second PR pattern 600-2 is formed to cover a portion (e.g., the portion overlaying the second side edge) of the first spacer 700a. That is, the second PR pattern 600-2 may be formed to cover a portion in which the pad unit is to be formed, e.g., a portion of the first spacer 700a at a right side of the second region A2. A horizontal cross-section of the second PR pattern 600-2 may have a rectangular shape. However, the horizontal cross-section of the second PR pattern 600-2 is not limited to the rectangular shape. For example, the second PR pattern 600-2 may have a round shape, an oval shape, or a polygonal shape. Since the second PR pattern 600-2 is formed to form an extension portion that function as a buffer in forming the pad unit, the second PR pattern 600-2 may be referred to as 'buffer PR pattern'.

According to the size of the second PR pattern 600-2, the size of the extension portion may be decided. For example, a width of the extension portion in the second direction may depend on a width of the second PR pattern 600-2 in the second direction. Also, a width of the extension portion in the first direction may depend on a width of the second PR pattern 600-2 in the first direction. That is, the width of the extension portion in the first direction may be decided according to the width of the second PR pattern 600-2 in the first direction, and a width of a trim region, which is to be formed, in the first direction.

In the illustrated working embodiment, while the second PR pattern 600-2 is formed to cover the portion of the first spacer 700a at the right side of the second region A2, one or more embodiments are not limited thereto, and the second PR pattern 600-2 may be formed on one of various portions and may have one of various sizes. Also, the number of second PR patterns 600-2 may be equal to or greater than 2. The structure, position, and number of second PR pattern(s) 600-2 will be described in the context of illustrated examples with reference to FIGS. 20 through 23.

Figure 9A:
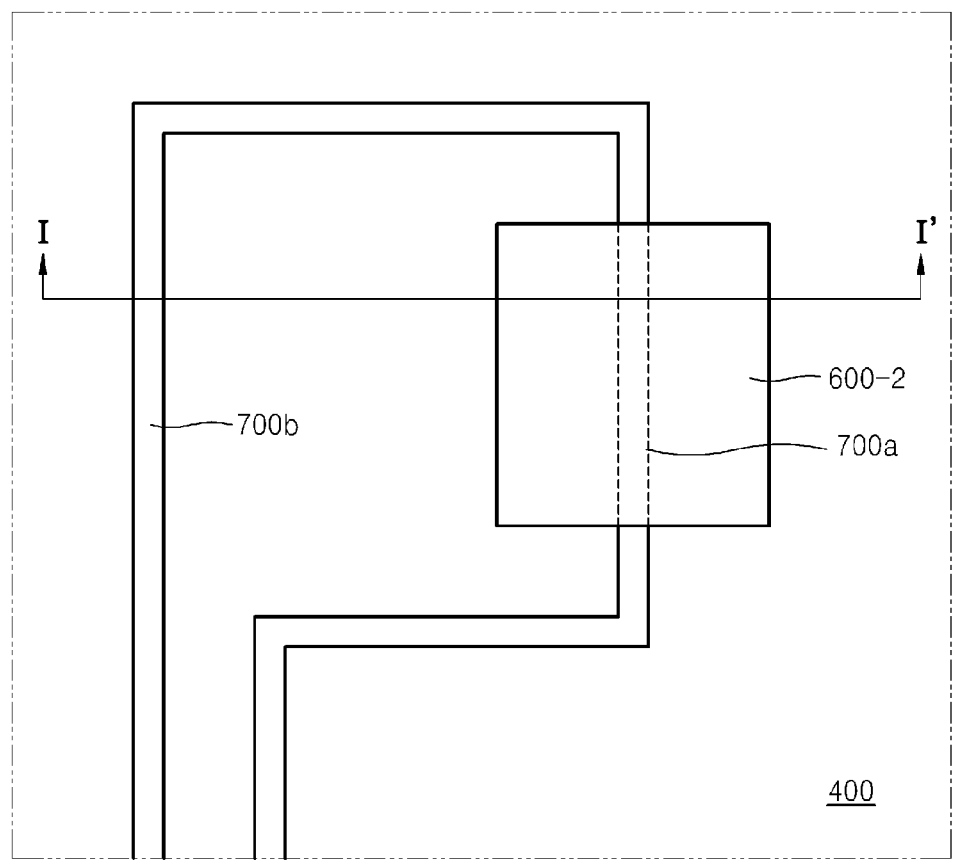
Figure 9B:
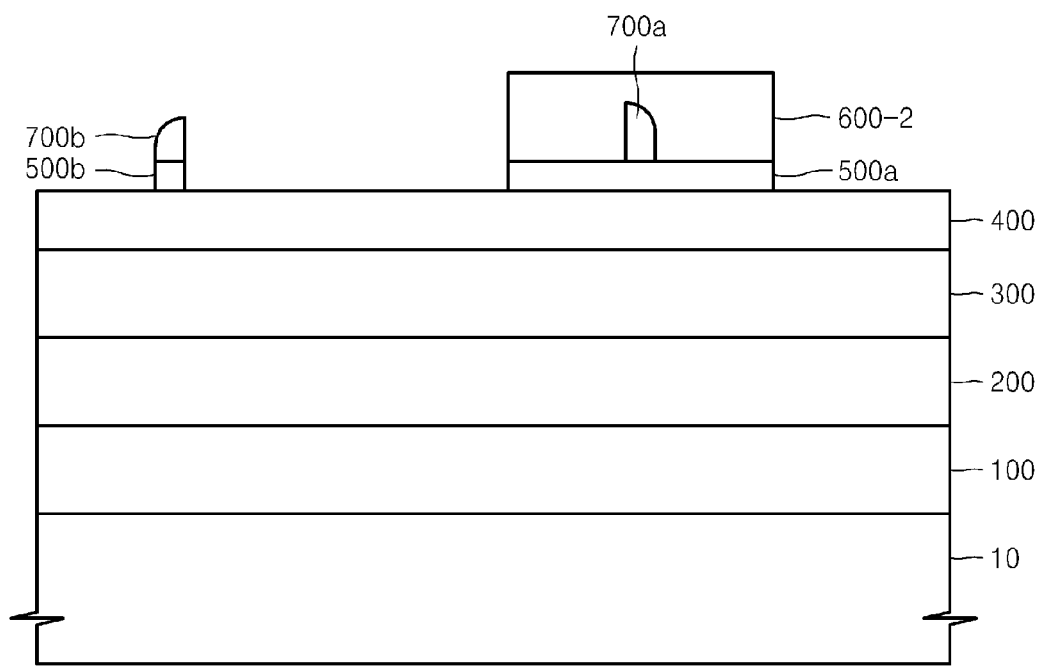

Referring to FIGS. 9A and 9B, the ARL 500 is dry-etched by using the second PR pattern 600-2 as an etching mask. When the ARL 500 is etched, the first spacer 700a that is not covered by the second PR pattern 600-2 but is exposed may be slightly etched. Accordingly, the first spacer 700b that is exposed at a left side may become thinner than the first spacer 700a that is covered by the second PR pattern 600-2 at the right side.

The ARL 500 is patterned by etching and then becomes a first ARL pattern 500a below the second PR pattern 600-2, and a second ARL pattern 500b below the first spacer 700b.

Figure 10A:
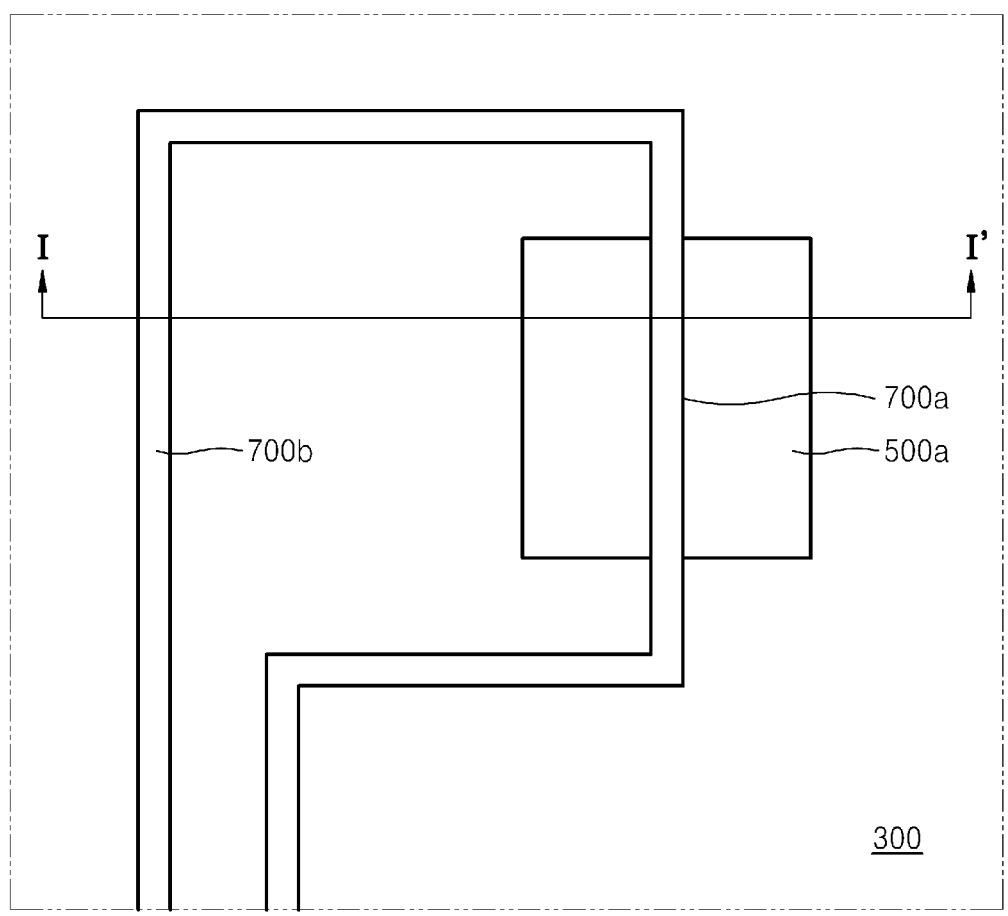
Figure 10B:
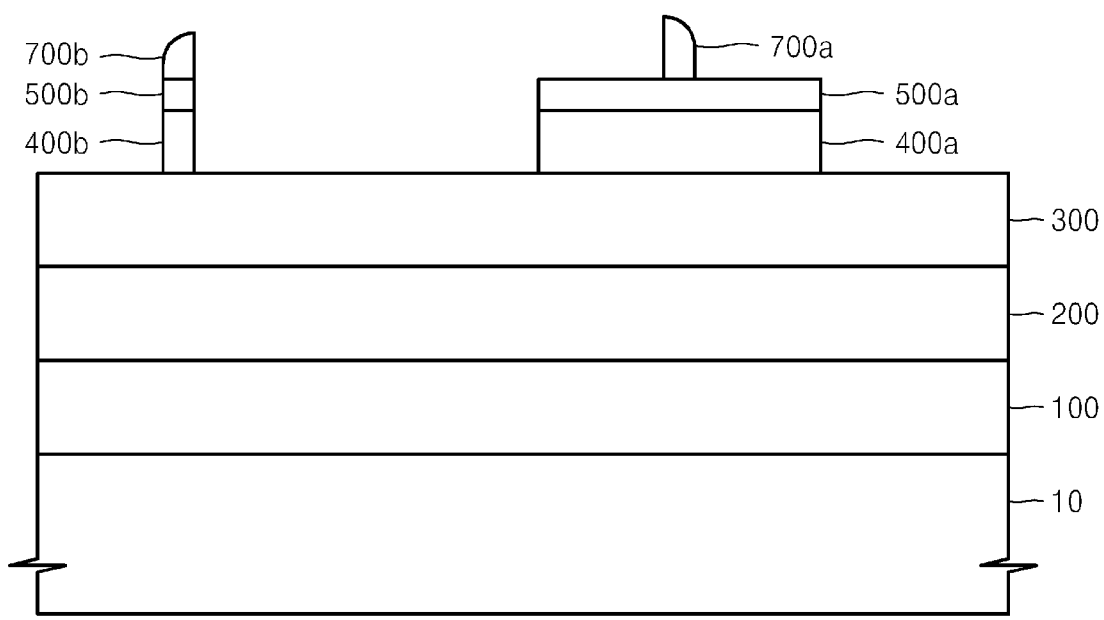

Referring to FIGS. 10A and 10B, the second sacrificial layer 400 is dry-etched by using the first spacers 700a and 700b, and the first and second ARL patterns 500a and 500b as an etching mask. If the second sacrificial layer 400 is formed of ACL or SOH, the second PR pattern 600-2 may also be removed when the second sacrificial layer 400 is etched. For example, since the second PR pattern 600-2 is formed of carbon-based polymer, the second PR pattern 600-2 may have a similar etching characteristic as ACL or SOH, so that the second PR pattern 600-2 may be etched and removed when the second sacrificial layer 400 is etched.

If the second sacrificial layer 400 is formed of polysilicon, after the second sacrificial layer 400 is etched, the second PR pattern 600-2 may be separately removed by performing an ashing and/or strip process. The second sacrificial layer 400 is patterned and thus becomes a right second sacrificial layer pattern 400a below the first ARL pattern 500a, and a left second sacrificial layer pattern 400b below the second ARL pattern 500b.

Figure 11A:
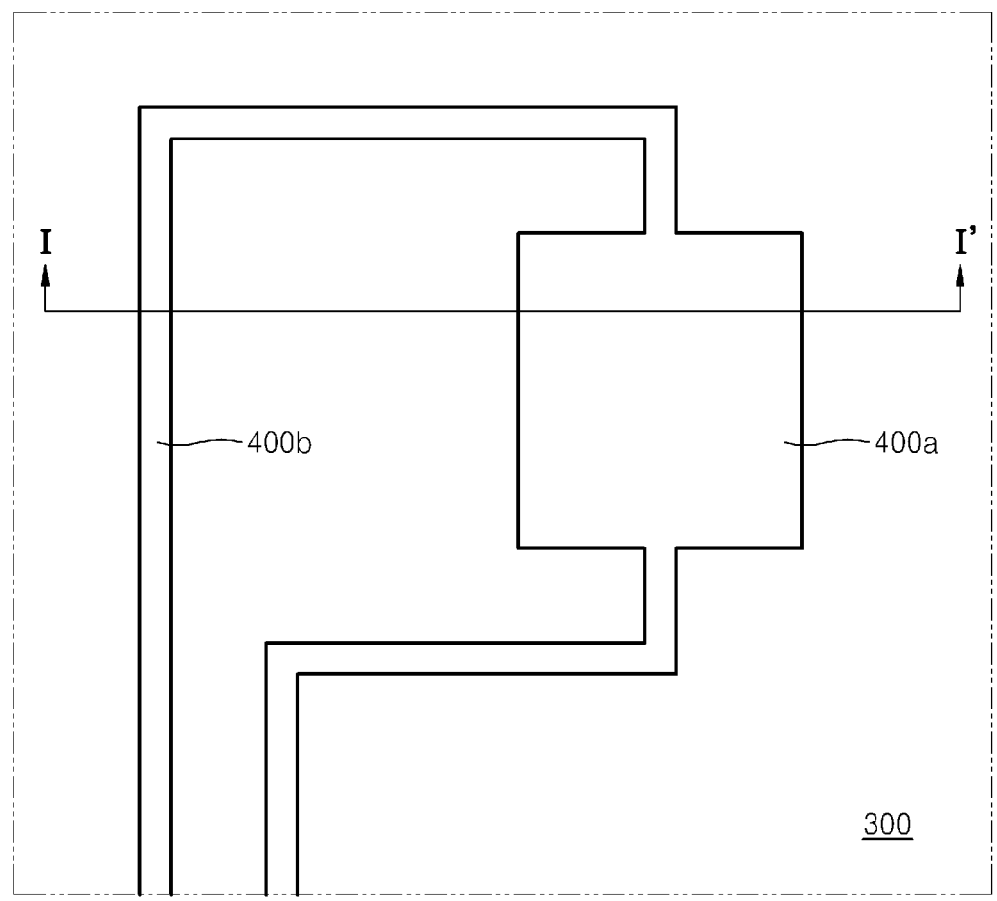
Figure 11B:
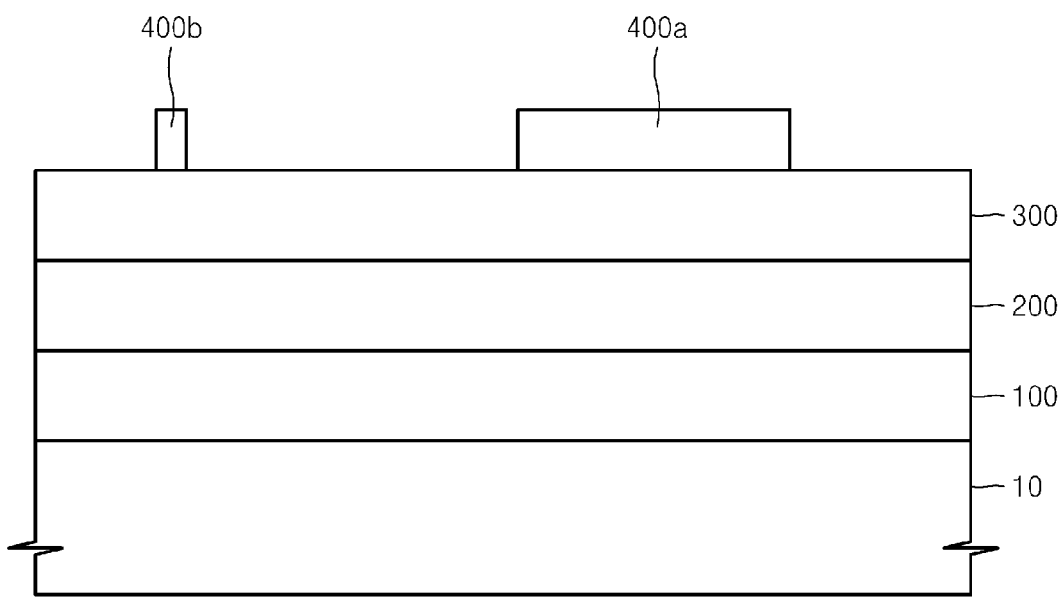

Referring to FIGS. 11A and 11B, the first spacers 700a and 700b and the first and second ARL patterns 500a and 500b are removed so that only the right and left second sacrificial layer patterns 400a and 400b are left. The first spacers 700a and 700b and the first and second ARL patterns 500a and 500b may be removed by using an etchant including HF.

Figure 12A:
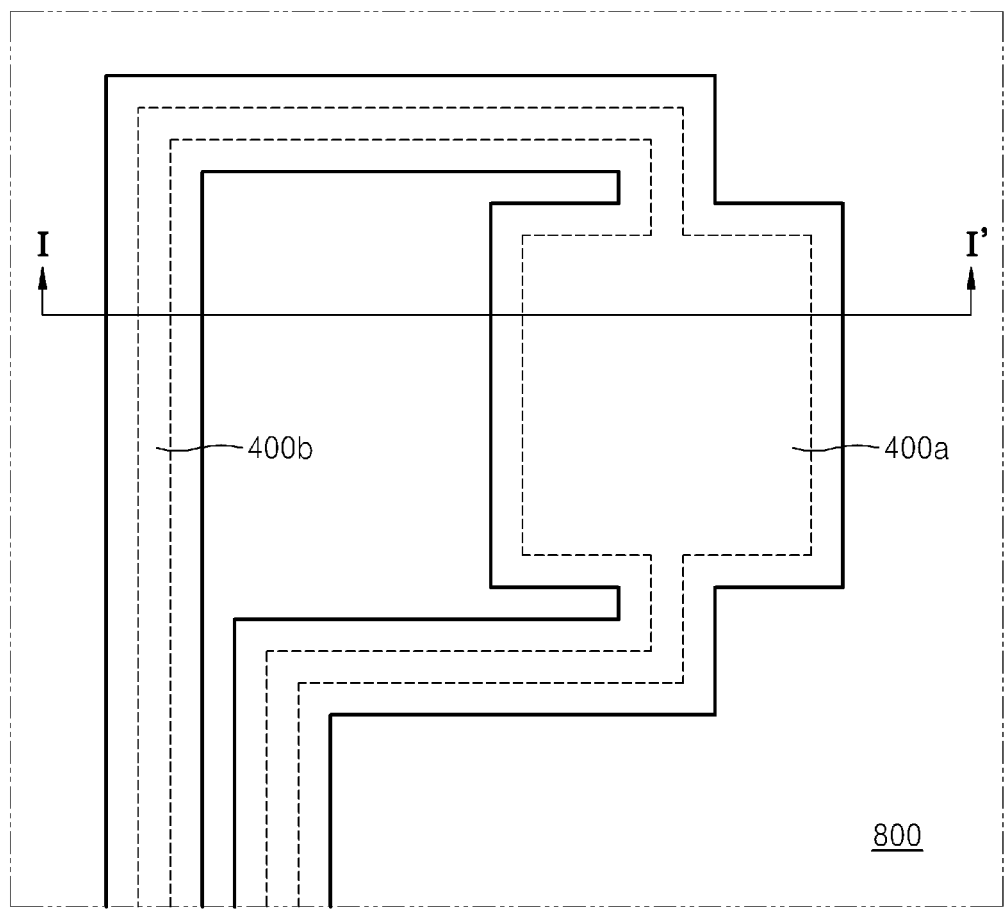
Figure 12B:
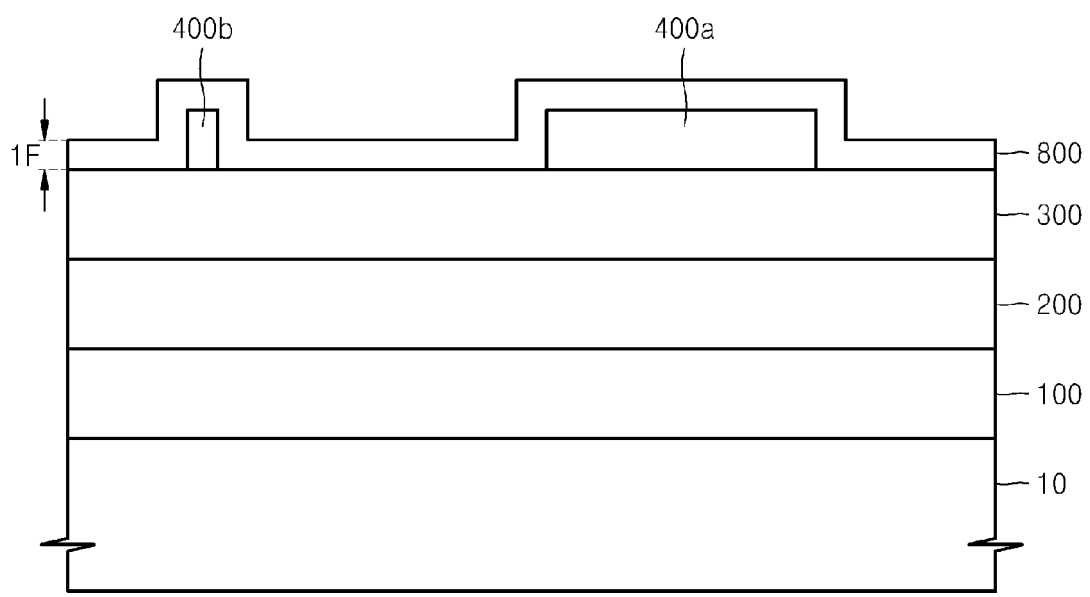

Referring to FIGS. 12A and 12B, a second spacer layer 800 is formed on the right and left second sacrificial layer patterns 400a and 400b, and the first sacrificial layer 300. The second spacer layer 800 may have a uniform thickness, for example, the second spacer layer 800 may have the same thickness as the target width (e.g., 1 F). Also, the second spacer layer 800 may be formed of a material having a different etch selectivity to the right and left second sacrificial layer patterns 400a and 400b, and the first sacrificial layer 300. For example, the second spacer layer 800 may be formed as an oxide layer including MTO.

Similar to the first spacer layer 700, so that the second spacer layer 800 has a uniform thickness, an ALD process may be used.

Figure 13A:
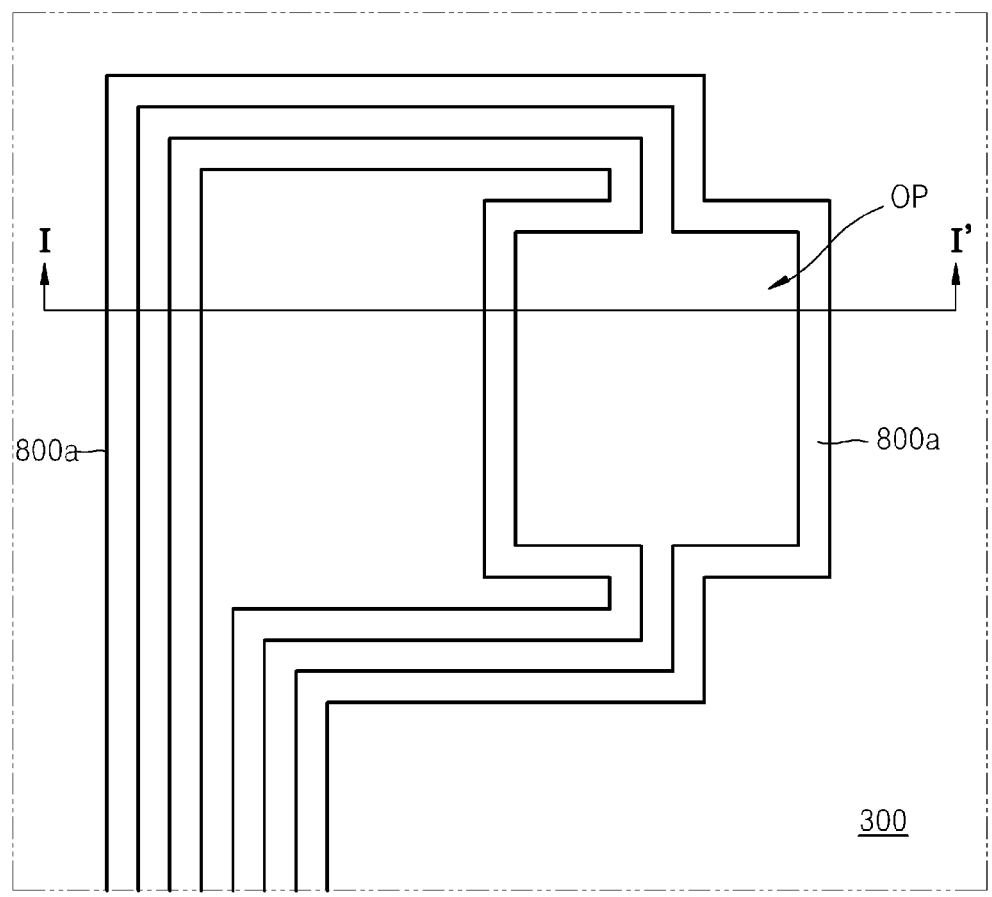
Figure 13B:
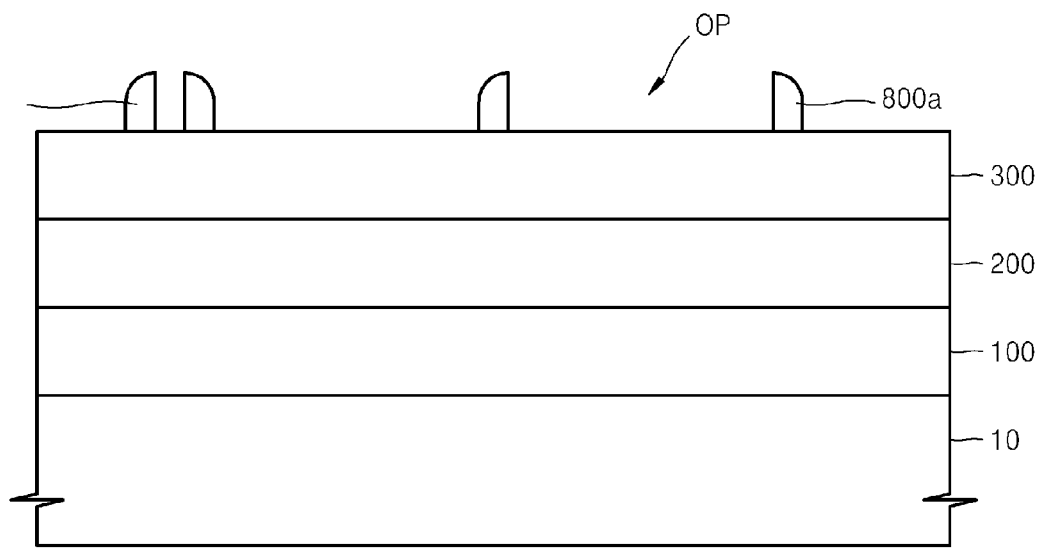

Referring to FIGS. 13A and 13B, an etch-back operation or a dry etching operation is performed on the second spacer layer 800 until a top surface of the first sacrificial layer 300 is exposed, so that a second spacer 800a covering side walls of the right and left second sacrificial layer patterns 400a and 400b are formed.

As illustrated in FIG. 13A, the second spacer 800a may cover (or surround) the sidewalls of the right and left second sacrificial layer patterns 400a and 400b. Also, as illustrated in FIG. 13B, the second spacer 800a may cover the top surface of the first sacrificial layer 300 by as much as the target width of 1 F. The aforementioned process of forming the first spacer 700a may be used to form the second spacer 800a.

After the second spacer 800a is formed, the right and left second sacrificial layer patterns 400a and 400b are removed so that only the second spacer 800a is left on the first sacrificial layer 300. For example, the right and left second sacrificial layer patterns 400a and 400b may be removed by performing an ashing and/or strip process. Due to the removal of the right and left second sacrificial layer patterns 400a and 400b, an open region OP corresponding to the second PR pattern may be formed. The open region OP is formed as two extension portions after a trim process is performed.

Figure 14A:
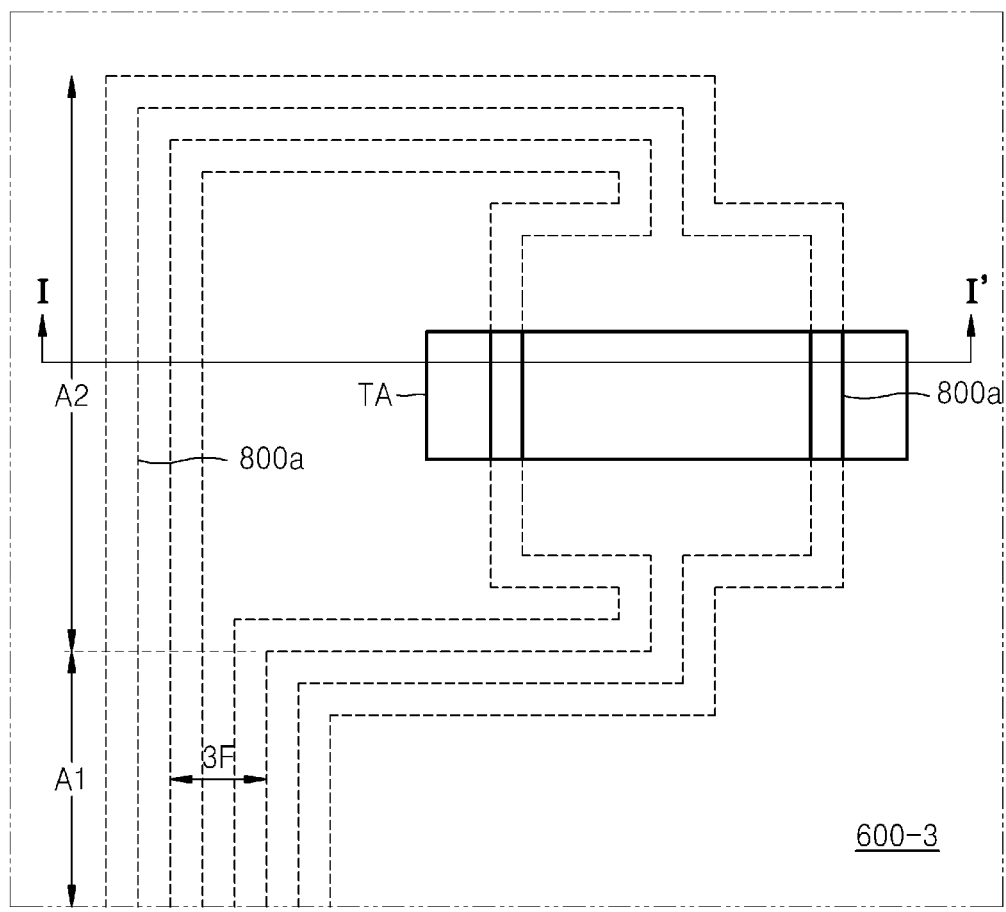
Figure 14B:
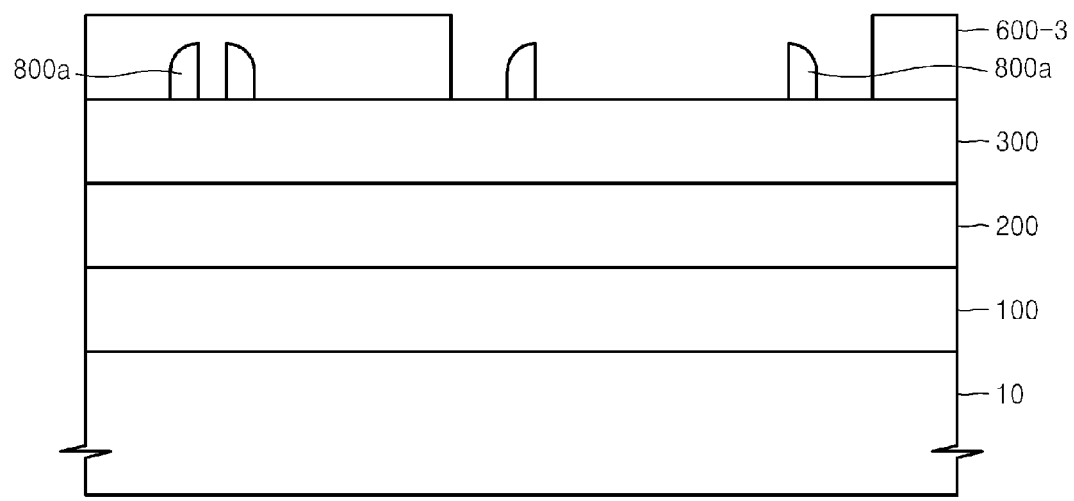

Referring to FIGS. 14A and 14B, in order to perform the trim process, a third PR pattern 600-3 is formed on the second spacer 800a and the first sacrificial layer 300. The trim process indicates a process for cutting two second spacers 800a that are connected to each other in the open region OP. That is, as illustrated in FIG. 14A, in the open region OP, two second spacers that are adjacent in the first region A1 meet other two adjacent second spacers. Since the four second spacers correspond to separate conductive lines, respectively, they cannot be connected to each other. Thus, via the trim process, the two second spacers 800a are cut. Since the third PR pattern 600-3 is used in the trim process, the third PR pattern 600-3 may be referred to as 'trim PR pattern'.

For the trim process, the third PR pattern 600-3 has a shape for exposing portions of the two second spacers 800a in a portion in which the second PR pattern 600-2 was formed. For example, the third PR pattern 600-3 may have the shape having an open portion that is rectangular and extends in the second direction, i.e., the third PR pattern 600-3 may have the trim region TA.

Figure 15A:
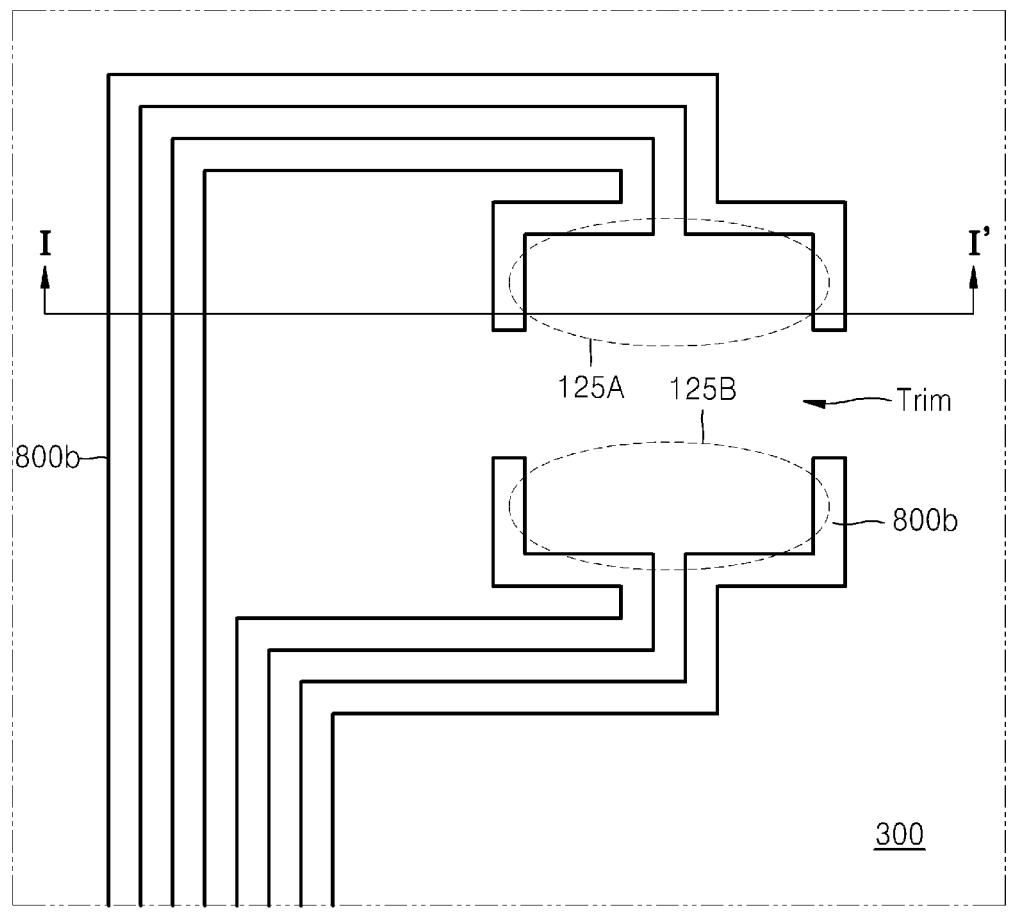
Figure 15B:
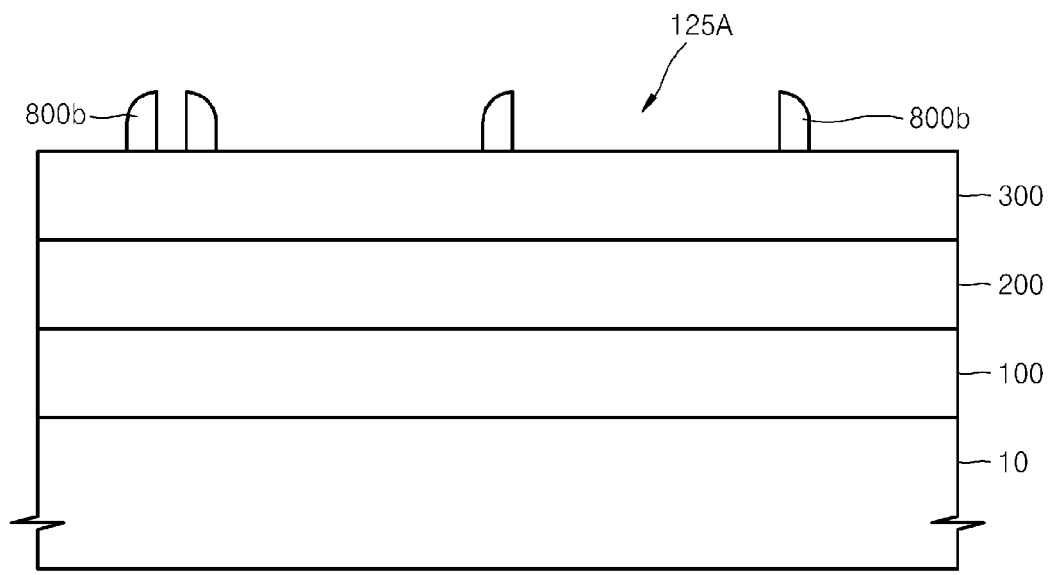

Referring to FIGS. 15A and 15B, the two second spacers 800a that are connected to each other in the portion in which the second PR pattern 600-2 was formed are etched by using the third PR pattern 600-3 as an etching mask and then are electrically open. Accordingly, the second spacers 800a may be divided into four separate spacers 800b. After the trim process is performed, the third PR pattern 600-3 is removed by performing an ashing and/or strip process. In the trim process, the portion in which the second PR pattern 600-2 was formed, i.e., the open region OP (refer to FIG. 13A) may be divided into two extension portions (i.e., the first and second extension portions 125A and 125B). Each of the first and second extension portions 125A and 125B may be surrounded by two neighbouring second conductive lines, except for a side toward the trim region. For example, the first extension portion 125A may be partially encompassed (be surrounded) by the second portions b1 and b2, and the bending portions c1 and c2, and the second extension portion 125B may be at least partially encompassed (or surrounded) by the second portions b3 and b4, and the bending portions c3 and c4.

The first and second extension portions 125A and 125B may have the same second-direction width as a second-direction width of the second PR pattern 600-2. Also, a first-direction width of the first and second extension portions 125A and 125B may be decided according to a first-direction width of the second PR pattern 600-2, and a first-direction width of the trim region TA. In addition, since portions of pads are formed in the first and second extension portions 125A and 125B, the first-direction width of the first and second extension portions 125A and 125B may be slightly decreased.

Figure 16A:
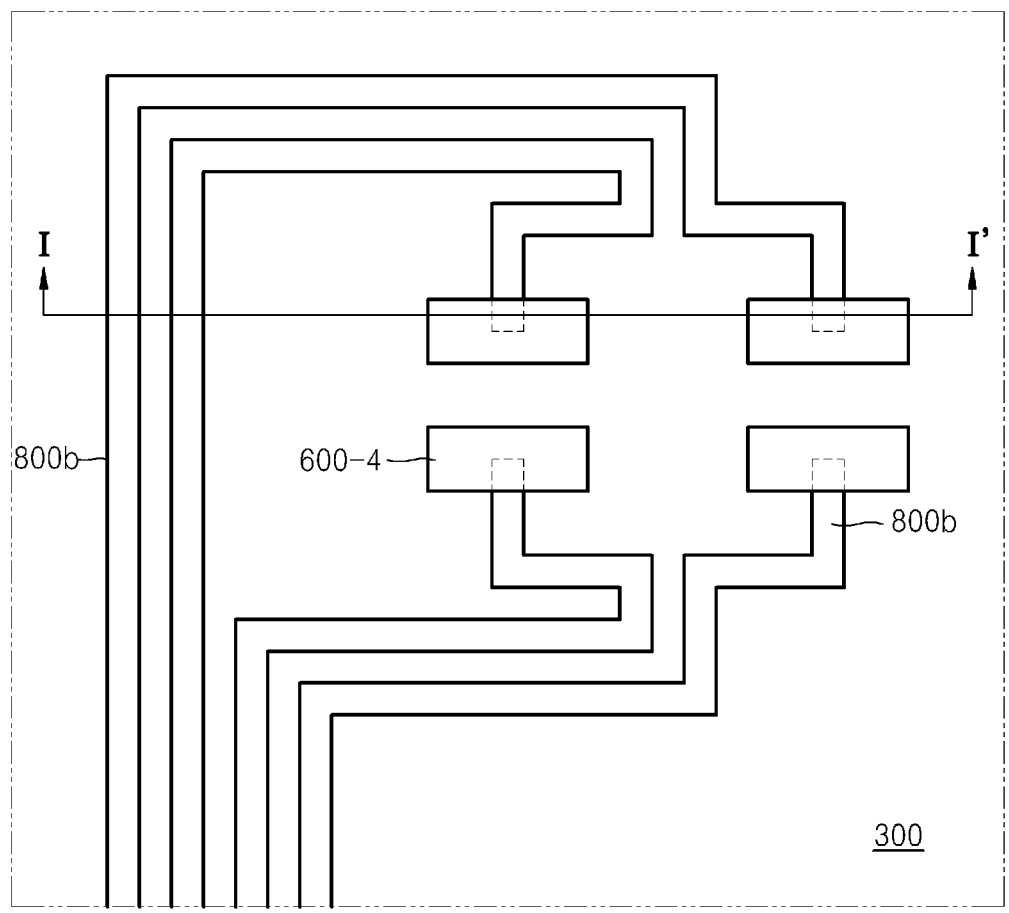
Figure 16B:
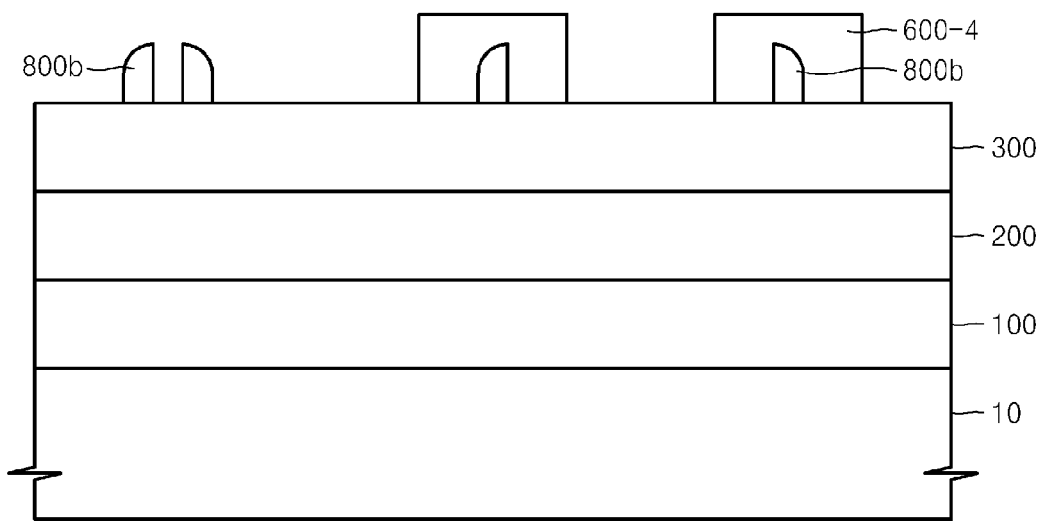

Referring to FIGS. 16A and 16B, a fourth PR pattern 600-4 is formed so as to form pads. The fourth PR pattern 600-4 may be formed to cover a portion of the end of each of the four separate spacers 800b that are cut by the trim process. That is, the four fourth PR patterns 600-4 may be formed to cover the ends of the four separate spacers 800b, respectively, which surround the first and second extension portions 125A and 125B. However, a structure of the fourth PR pattern 600-4 is not limited thereto. In other words, the fourth PR pattern 600-4 may be positioned anywhere as long as the fourth PR pattern 600-4 covers a portion of each separate spacer 800b. Since the fourth PR pattern 600-4 is used in a pad forming process, the fourth PR pattern 600-4 may be referred to as 'pad PR pattern'.

However, except for regions of the first and second extension portions 125A and 125B, a gap between the two adjacent separate spacers 800b is only 1 F. Thus, if the fourth PR pattern 600-4 is formed in a portion having a 1 F gap, a process margin is only about 0.5 F such that it may be very difficult to form the fourth PR pattern 600-4. However, a gap between the adjacent separate spacers 800b may be large in the regions of the first and second extension portions 125A and 125B, so that the fourth PR pattern 600-4 may be easily formed with a sufficient process margin.

Figure 17A:
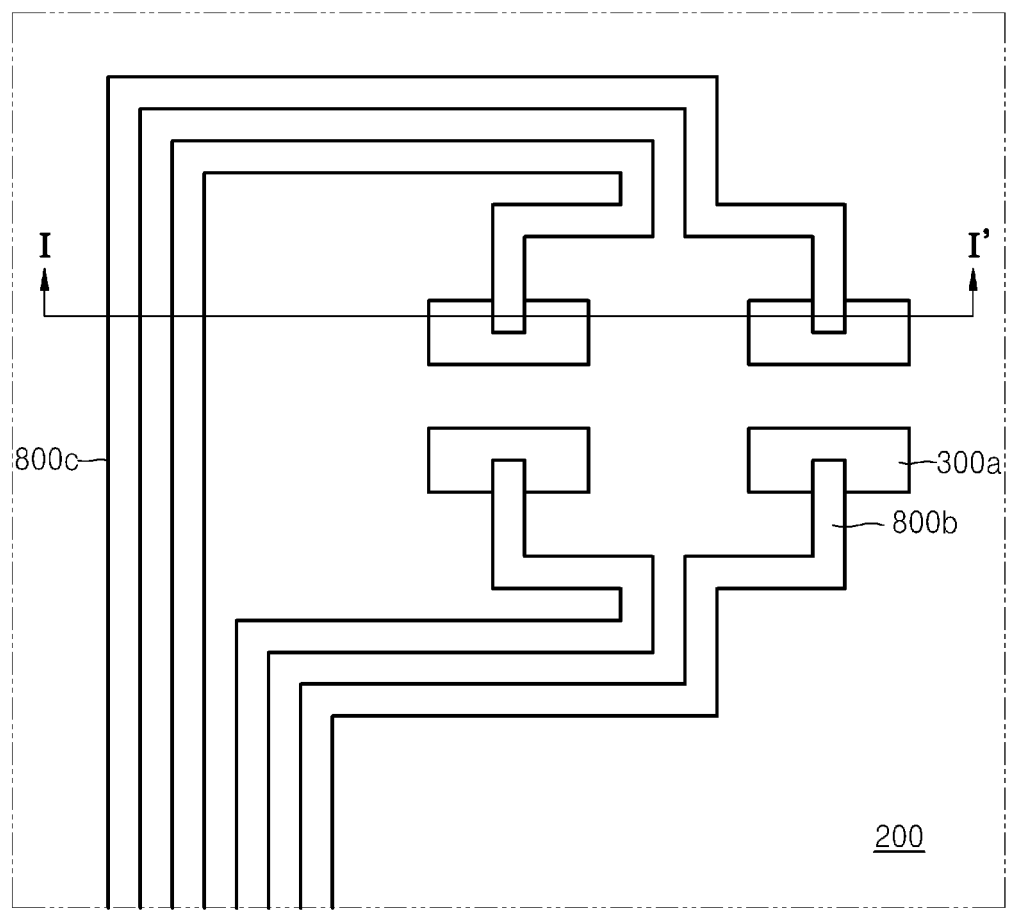
Figure 17B:
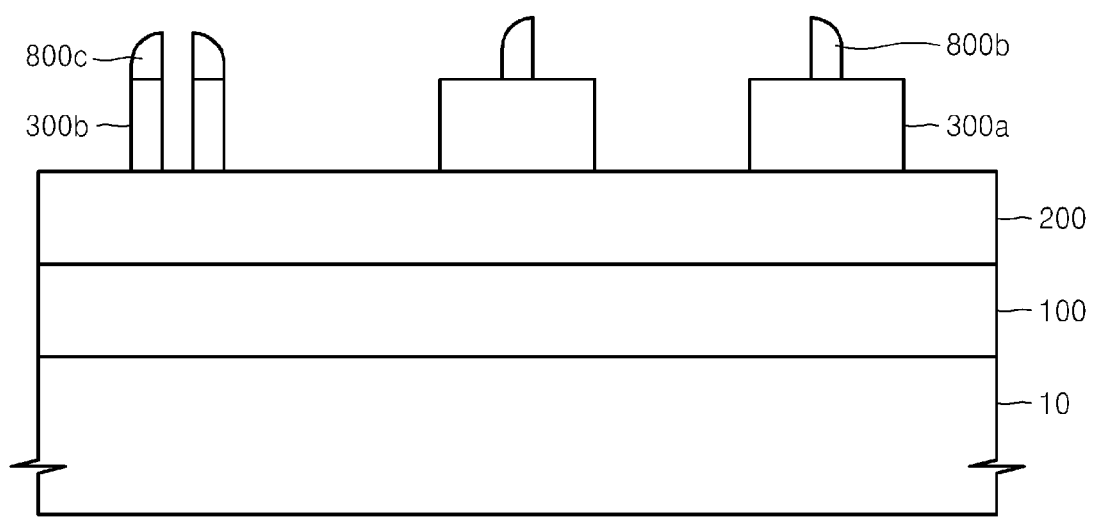

Referring to FIGS. 17A and 17B, first sacrificial layer patterns 300a and 300b are formed by etching the first sacrificial layer 300 by using the fourth PR pattern 600-4. The first sacrificial layer patterns 300a and 300b may be divided into the right first sacrificial layer pattern 300a below the fourth PR pattern 600-4, and the left first sacrificial layer pattern 300b in a region where the fourth PR pattern 600-4 was not formed.

After the first sacrificial layer patterns 300a and 300b are formed, the fourth PR pattern 600-4 may be removed by performing an ashing and/or strip process. In addition, while an etching operation is performed on the first sacrificial layer 300, the separate spacer 800b in the region where the fourth PR pattern 600-4 was not formed may be more or less removed. Thus, a second spacer 800c in a left side of the region where the fourth PR pattern 600-4 was not formed may be thinner than the separate spacer 800b at a right side of a region where the fourth PR pattern 600-4 was formed.

Figure 18A:
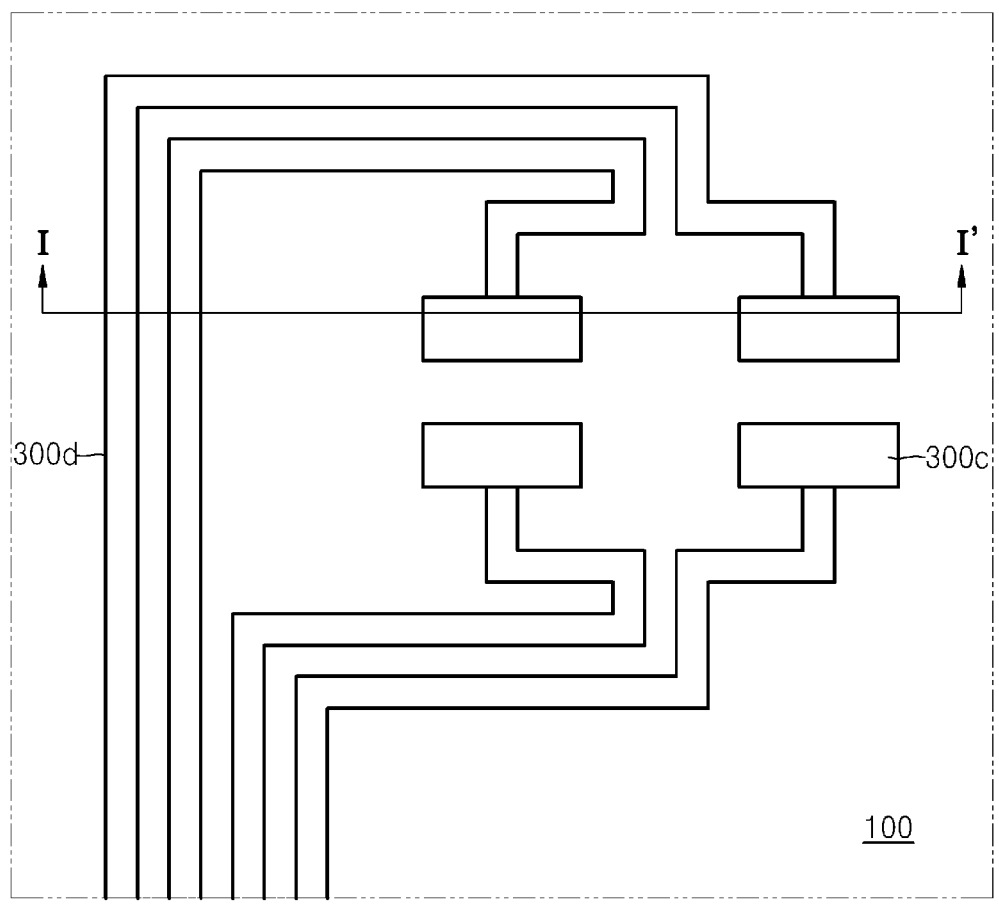
Figure 18B:
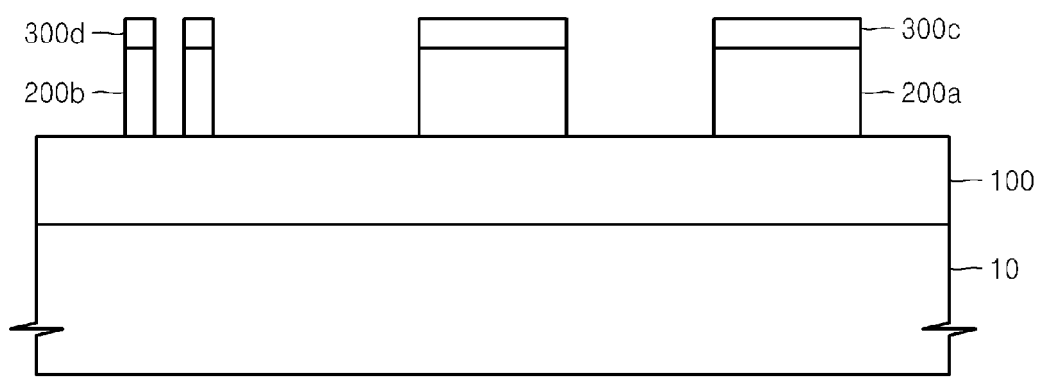

Referring to FIGS. 18A and 18B, mask patterns 200a and 200b are formed by etching the mask layer 200 by using the first sacrificial layer patterns 300a and 300b. As described above, both the mask layer 200 and the second spacers 800b and 800c are formed of an oxide-based material, so that, when the mask layer 200 is etched, the second spacers 800b and 800c may also be removed. Also, after the mask layer 200 is etched, the first sacrificial layer patterns 300a and 300b are more or less etched, so that the first sacrificial layer patterns 300a and 300b left on the mask patterns 200a and 200b may become thin before the mask layer 200 is etched.

Afterward, when the mask patterns 200a and 200b are transferred on the target layer 100 by an etching process, conductive patterns shown in FIG. 4, e.g., the first conductive line unit 110, the second conductive line unit 120, and the pad unit 130 may be formed.

Figure 19A:
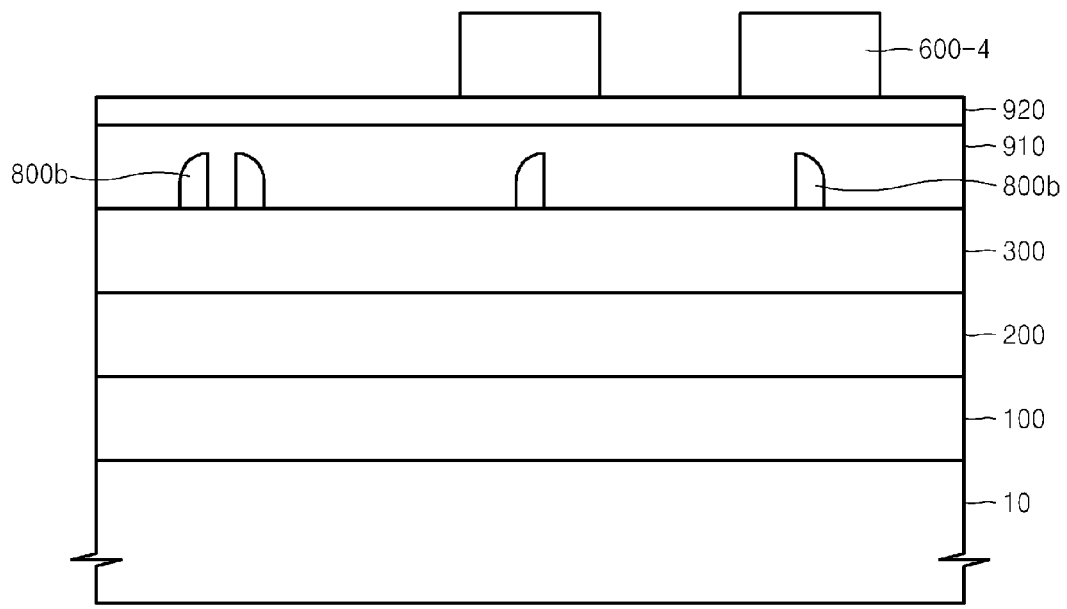
FIGS. 19A and 19B are cross-sectional views illustrating another example of a process shown in FIG. 16B, which may replace a process of FIG. 16B.
Figure 19B:
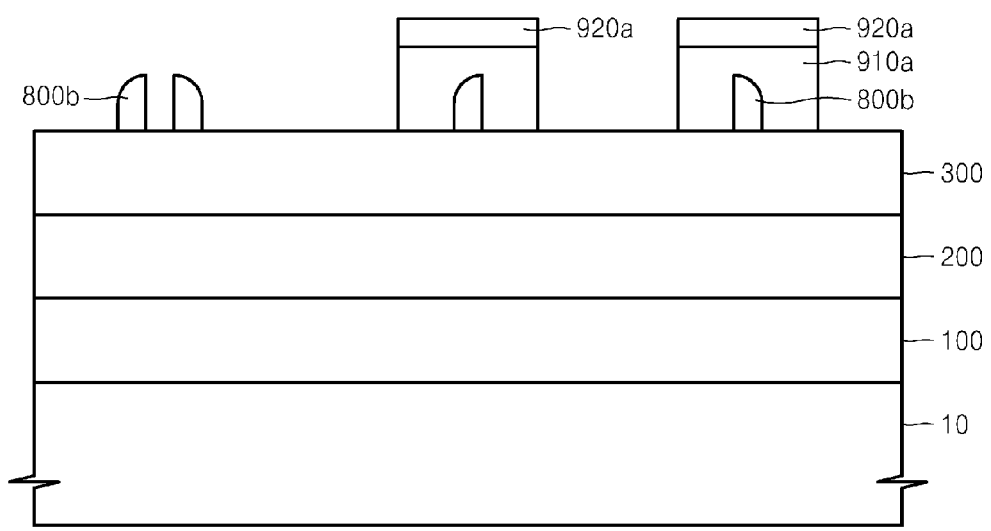

FIGS. 19A and 19B are cross-sectional views illustrating another example of a process shown in FIG. 16B, which may replace the process of FIG. 16B.

Referring to FIG. 19A, after the trim process, a third sacrificial layer 910 that covers the second spacer 800b, and an ARL 920 are formed on the first sacrificial layer 300. If the first sacrificial layer 300 is formed of polysilicon, the third sacrificial layer 910 may be formed of ACL or SOH. The ARL 920 may be formed of SiON, and a BARC layer (not shown) may be further formed on the ARL 920.

A fourth PR pattern 600-4 for the pads may be formed on the third sacrificial layer 910 and the ARL 920. A position and structure of the fourth PR pattern 600-4 may be the same as those of the fourth PR pattern 600-4 of FIG. 16B. In this regard, although the fourth PR pattern 600-4 directly covers the second spacer 800b in the process of FIG. 16B, according to the process of FIGS. 19A and 19B, the fourth PR pattern 600-4 is formed on the ARL 920.

Referring to FIG. 19B, the third sacrificial layer 910 and the ARL 920 are etched by using the fourth PR pattern 600-4 as an etching mask, so that a third sacrificial layer pattern 910a and an ARL pattern 920a are formed. When the third sacrificial layer 910 and the ARL 920 are etched, a portion of the fourth PR pattern 600-4 may also be etched. The residual portion of the fourth PR pattern 600-4 may be removed by performing an ashing and/or strip process.

The third sacrificial layer pattern 910a and the ARL pattern 920a may perform the same function as that of the fourth PR pattern 600-4 in the process of FIG. 16B. That is, by performing the processes starting from FIG. 17A by using the third sacrificial layer pattern 910a and the ARL pattern 920a as etching masks, lower layers may be etched.

FIGS. 20 through 23 are plane views illustrating other examples of the semiconductor device pattern forming procedure of FIG. 4, according to embodiments of the inventive concept. For convenience of description, detailed descriptions, which are the same as the aforementioned contents with reference to FIG. 1, will be omitted or briefly described. Also, for convenience of description, FIGS. 20 through 23 are not final drawings of conductive lines but are drawings corresponding to a state of FIG. 13A. That is, FIGS. 20 through 23 illustrate states in which a second PR pattern and second spacers are formed, and then the second PR pattern is removed.

Figure 20:
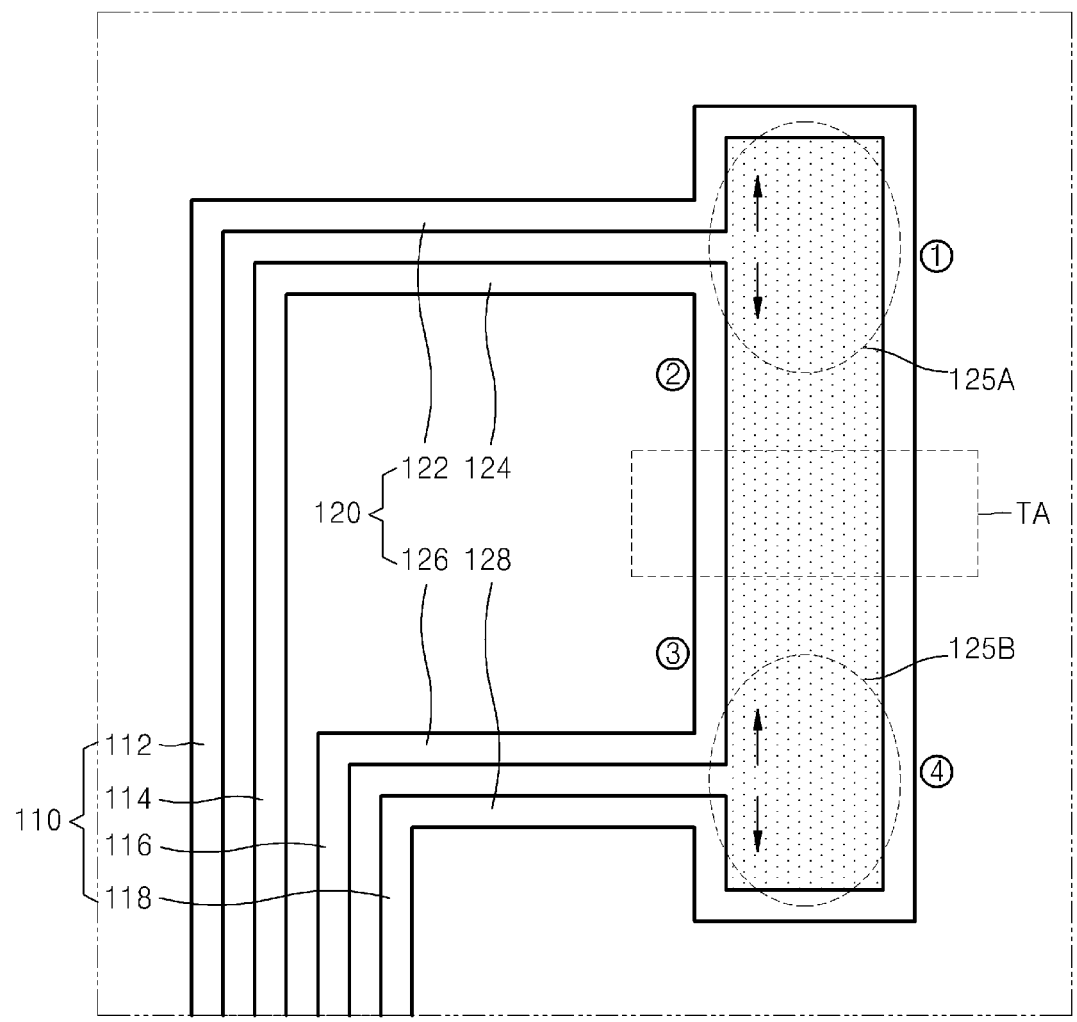
FIGS. 20 through 23 are plane views illustrating other examples of the semiconductor device pattern forming procedure of FIG. 4, according to embodiments of the inventive concept.

Referring to FIG. 20, in a semiconductor device according to the present embodiment, a first-direction width of two extension portions 125A and 125B may be larger than that of the extension portions 125A and 125B of FIG. 4. Here, a hatched portion indicates a region in which a second PR pattern was formed, and TA indicates a trim region.

In more detail with respect to the two extension portions 125A and 125B, an upper boundary of a space corresponding to the first extension portion 125A may be higher than an upper end of a first conductive line 112. Also, a lower boundary of a space corresponding to the second extension portion 125B may be lower than an upper end of a fourth conductive line 118. However, alternatively, the upper boundary of the first extension portion 125A may be even with the upper end of the first conductive line 112, or may be lower than the upper end of the first conductive line 112, and also, the lower boundary of the second extension portion 125B may be even with the upper end of the fourth conductive line 118, or may be higher than the upper end of the fourth conductive line 118.

Similarly to the case of FIG. 4, the first and second extension portions 125A and 125B may be symmetrical to each other about the trim region TA. Accordingly, both side surfaces of the first extension portion 125A, and both side surfaces of the second extension portion 125B may form plane surfaces. Also, in order to form the first and second extension portions 125A and 125B, two adjacent second conductive lines may have portions (indicated as arrows) extending in an opposite direction. Reference numerals ①, ②, ③, and ④ indicate portions to be formed as pads. However, pad positions are not limited thereto. For example, if there are any portions that are connected to second conductive lines while a sufficient margin of the two extension portions 125A and 125B is used, the pads may be formed on the portions.

Figure 21:
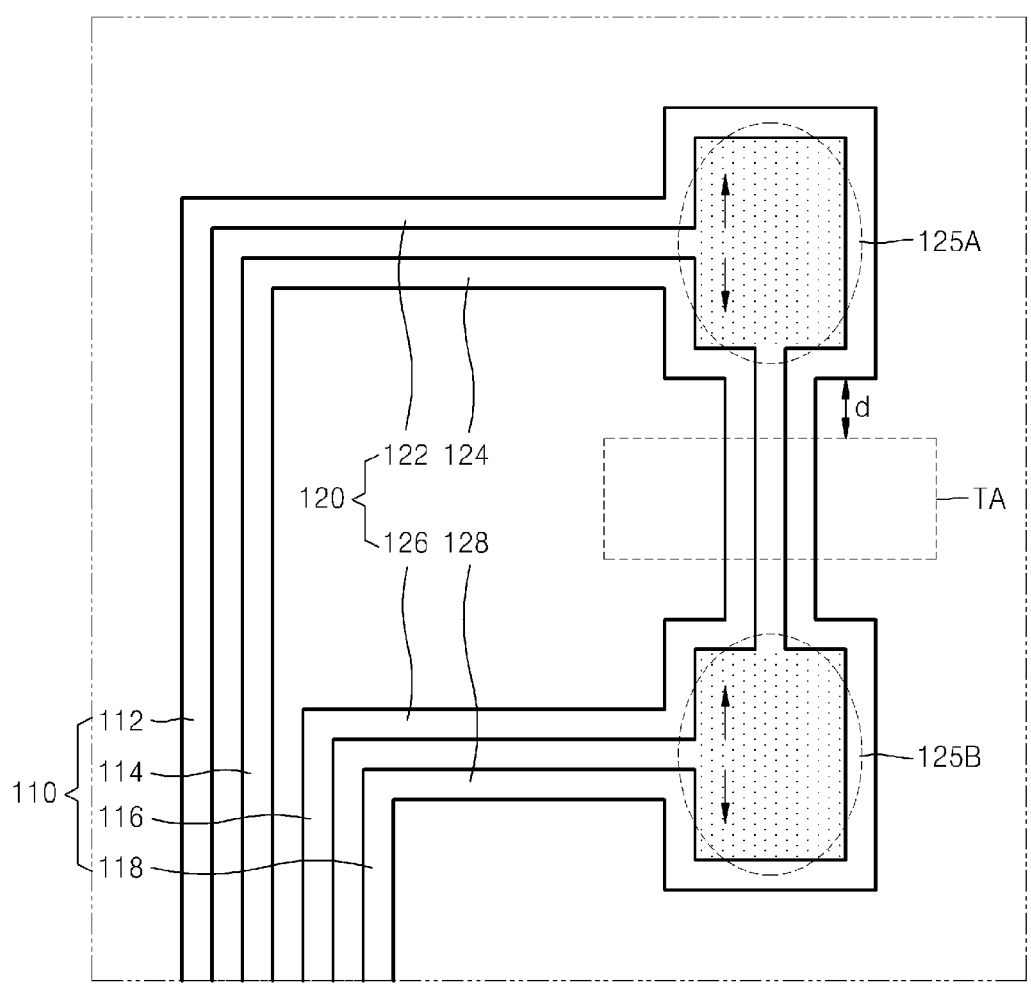

Referring to FIG. 21, in a semiconductor device according to the present embodiment, two extension portions 125A and 125B may be formed by second PR patterns (hatched portions), respectively. Also, each of two adjacent second conductive lines may have a connection part d between the two extension portions 125A and 125B. For example, second conductive lines 122 and 124 that are adjacent to each other may have the connection parts d, respectively, that are separated by a 1 F gap.

Here, the label "TA" indicates a trim region. Also, in the illustrated embodiment, in order to form the first and second extension portions 125A and 125B, two adjacent second conductive lines may have portions (indicated as arrows) extending in an opposite direction.

Figure 22:
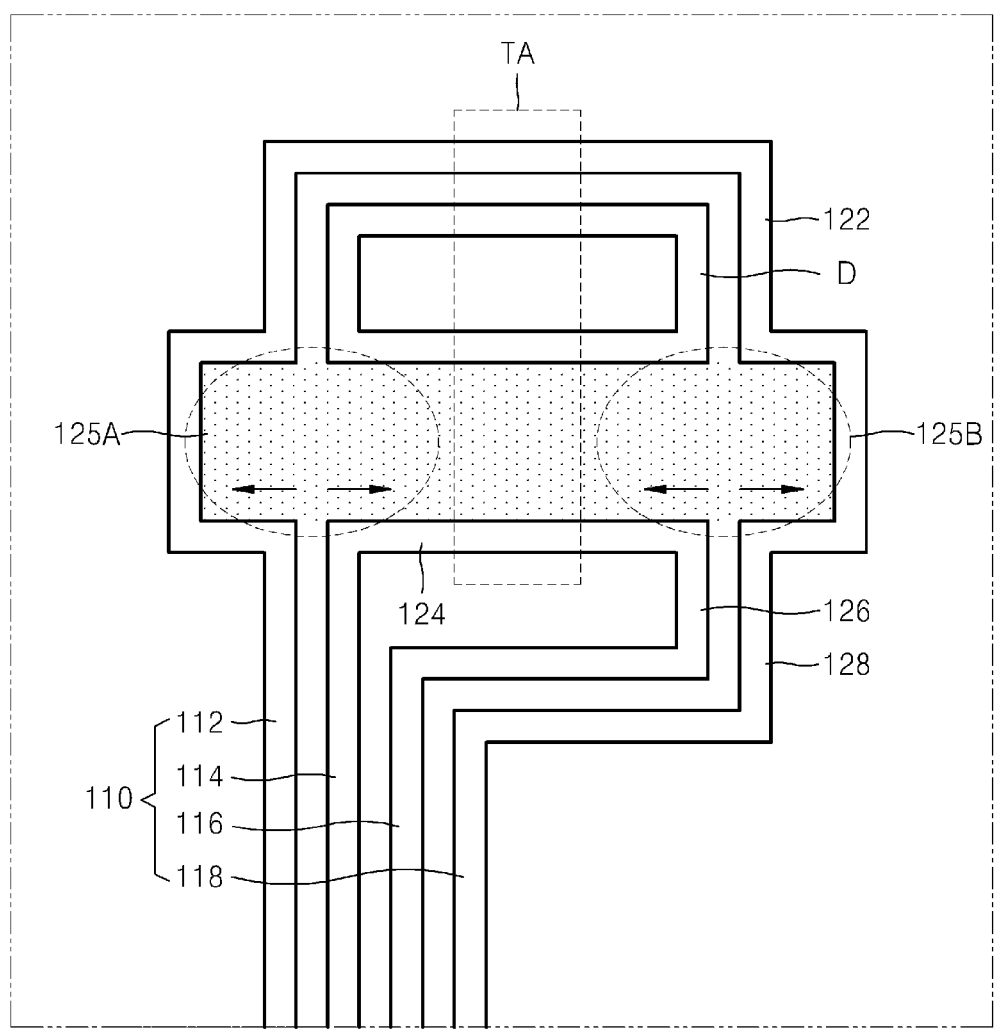

Referring to FIG. 22, in a semiconductor device according to the present embodiment, first and second extension portions 125A and 125B may be disposed in left and right directions with respect to a trim region TA. So that the first and second extension portions 125A and 125B are disposed in that manner, a second PR pattern (a hatched portion) may extend in the second direction. A pattern of a D portion may be a dummy pattern that is not connected to other conductive lines, and thus, may be used to form pads. In FIG. 22, a left surface of the first extension portion 125A is more leftward than a first conductive line 112. However, the left surface of the first extension portion 125A may be even with the first conductive line 112. Also, a right surface of the second extension portion 125B may not be more rightward than the second conductive lines 122 and 128.

In a semiconductor device according to the present embodiment, in order to form the first and second extension portions 125A and 125B, two adjacent second conductive lines may also have portions (indicated as arrows) extending in an opposite direction.

Figure 23:
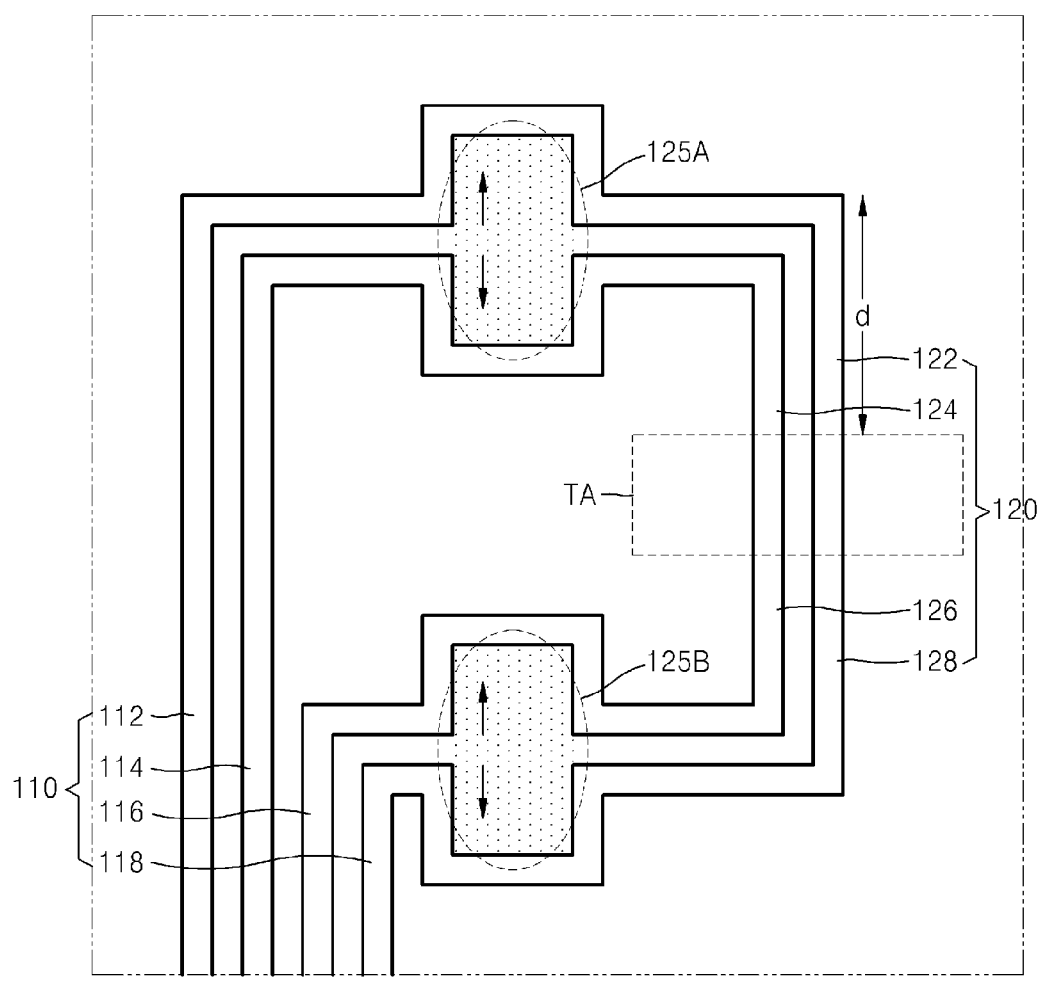

Referring to FIG. 23, in a semiconductor device according to the present embodiment, first and second extension portions 125A and 125B may be formed by portions in which second conductive lines 122, 124, 126, and 128 extend from first conductive lines 112, 114, 116, and 118 in the second direction. Also, the first and second extension portions 125A and 125B may be formed by second PR patterns (hatched portions), respectively. Connection parts d of the second conductive lines 122, 124, 126, and 128 may be more rightward than the first and second extension portions 125A and 125B. A trim region TA may be formed at the connection parts d.

If the connection parts d of the second conductive lines 122, 124, 126, and 128 have a sufficient length in the first direction, another second PR pattern may be formed at the connection parts d, and thus a third extension portion (not shown) may be formed. By doing so, pad forming positions may be a further option.

In the present embodiment, in order to form the first and second extension portions 125A and 125B, two adjacent second conductive lines may also have portions (indicated as arrows) extending in an opposite direction. Also, pads may be connected to the second conductive lines in regions where the first and second extension portions 125A and 125B are formed.

Figure 24:
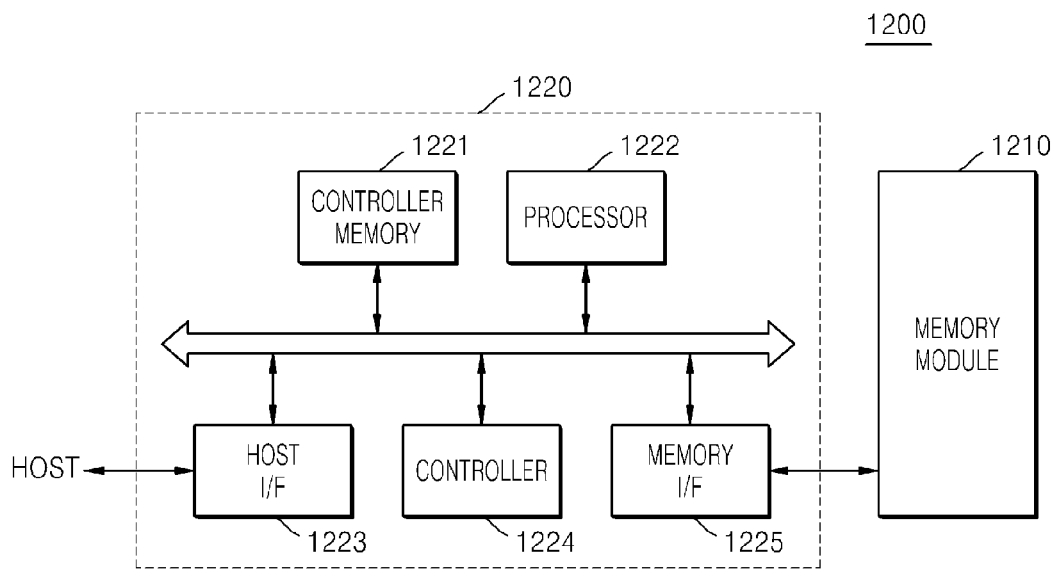
FIG. 24 is a block diagram of a memory card including a semiconductor device, according to an embodiment of the inventive concept.

FIG. 24 is a block diagram of a memory card 1200 including a semiconductor device according to an embodiment of the inventive concept.

Referring to FIG. 24, the memory card 1200 includes a memory controller 1220 for generating command and address signals, and a memory module 1210 that may be a flash memory including one or more flash memory devices. The memory controller 1220 includes a host interface 1223 for exchanging the command and address signals with an host, and a memory interface 1225 for exchanging the command and address signals with the memory module 1210. The host interface 1223, a controller 1224, and the memory interface 1225 communicate with a controller memory 1221, such as a static random access memory (SRAM), and a processor 1222, such as a central processing unit (CPU), via a common bus.

The memory module 1210 receives the command and address signals from the memory controller 1220, and in response to the command and address signals, the memory module 1210 stores data in at least one of the flash memory devices of the memory module 1210 or reads data from at least one of the flash memory devices. Each of the flash memory devices includes a plurality of memory cells and a decoder that receives the command and address signals and generates line and row signals so as to access at least one of the memory cells to be addressed during programming and read operations.

Figure 25:
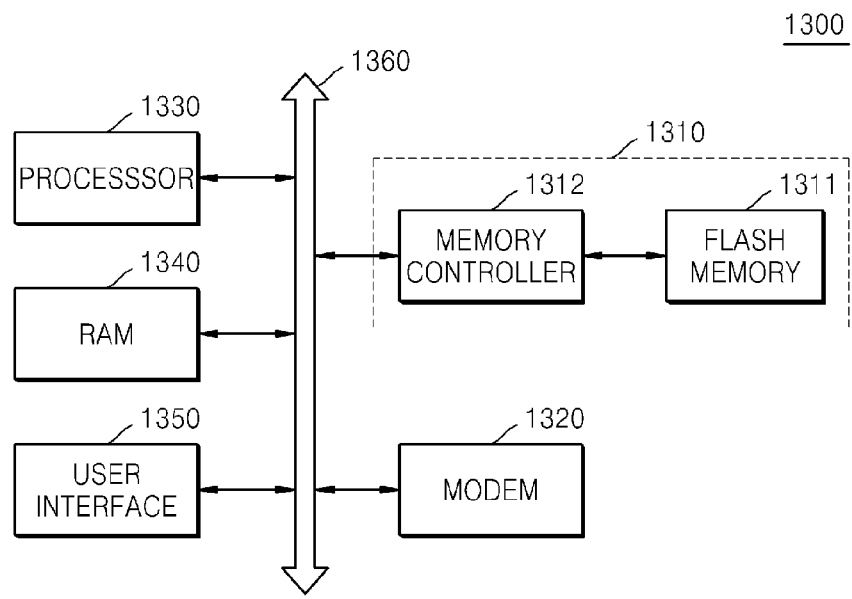
FIG. 25 is a block diagram of a memory system using a memory card including a semiconductor device, according to an embodiment of the inventive concept.

Elements of the memory card 1200, e.g., electronic devices 1221, 1222, 1223, 1224, and 1225 included in the memory controller 1220, and the memory module 1210 may be formed to include fine patterns, i.e., conductive lines and pads that are formed by the processes according to the one or more embodiments of the inventive concept FIG. 25 is a block diagram of a memory system 1300 using a memory card including a semiconductor device, according to an embodiment of the inventive concept.

Referring to FIG. 25, the memory system 1300 may include a processor 1330 such as a CPU, a random access memory (RAM) 1340, a user interface 1350, and a modem 1320 that perform communication via a common bus 1360.

Each of the aforementioned elements exchanges a signal with a memory card 1310 via the common bus 1360. Elements of the memory system 1300, including the memory card 1310, the processor 1330, the RAM 1340, the user interface 1350, and the modem 1320, may be formed to include fine patterns, i.e., conductive lines and pads that are formed by the processes according to the one or more embodiments of the inventive concept.

The memory system 1300 can be applied to various electronic application fields, i.e., solid state drives (SSD), CMOS image sensor (CIS), and computer application chip sets.

The memory systems and the devices in the one or more embodiments of the inventive concept may be packaged as one of various types of device packages including a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stock package (WSP), or the like. However, a package structure is not limited to the aforementioned examples.

According to a semiconductor device and a method of manufacturing the semiconductor device according to the one or more embodiments of the inventive concept, an extension portion having a broad space is formed by using the buffer PR pattern, and the pads are formed in the extension portion, whereby the high-density patterns having an ultrafine width and gap may be formed, and the pads may be formed with a sufficient process margin.

While the inventive concept has been particularly shown and described with reference to exemplary embodiments thereof, it will be understood that various changes in form and details may be made therein without departing from the scope of the following claims.

What is claimed is:

1. A semiconductor device comprising:
   a substrate comprising a memory cell region, a connection region and a group of conductive lines each having a unit width, being arranged in parallel along a defined center line, including a first conductive line and a second conductive line, and extending in a first direction from the memory cell region into the connection region,
   wherein the first conductive line has a first length in the first direction extending away from the memory cell region that ends in a first portion extending a second length in a second direction away from the center line, the first portion terminates in a portion bending back in the first direction towards the memory cell region to connect a second portion extending in the second direction away from the center line to connect a first pad; and
   the second conductive line has a third length less than the first length extending in the first direction away from the memory cell region and ends in a first portion extending a fourth length less than the second length in the second direction away from the center line, the first portion terminates in a portion bending back in the first direction towards the memory cell region to connect a second portion extending in the second direction back towards the center line to connect a second pad, and
   a width separating the first pad from the second pad is greater than the unit width.

2. The semiconductor device of claim 1, wherein the unit width is less than a minimum width realizable by photolithography equipment used to form the group of conductive lines.

3. The semiconductor device of claim 1, wherein the group of conductive lines further includes a third conductive line and a fourth conductive line,
   wherein the third conductive line has a fifth length less than the third length in the first direction extending away from the memory cell region that ends in a first portion extending a sixth length less than the fourth length in a second direction away from the center line, the first portion terminates in a portion bending in the first direction away the memory cell region to connect a second portion extending in the second direction towards the center line to connect a third pad;
   the fourth conductive line has a seventh length less than the fifth length extending in the first direction away from the memory cell region and ends in a first portion extending a eighth length less than the sixth length in the second direction away from the center line, the first portion terminates in a portion bending in the first direction away from the memory cell region to connect a second portion extending in the second direction away from the center line to connect a fourth pad, and
   a width separating the third pad from the fourth pad is greater than the unit width.

4. The semiconductor device of claim 3, wherein the first and third pads are symmetrically disposed facing each other in a trim region, and the second and fourth pads are symmetrically disposed facing each other in the trim region.

5. The semiconductor device of claim 4, wherein the respective first portions of first, second, third and fourth conductive lines are arranged in parallel and extended in the second direction towards the trim region away from the center line.

6. The semiconductor device of claim 4, wherein the trim region is rectangular in shape.

7. The semiconductor device of claim 3, wherein the first, second, third and fourth conductive lines are respectively word lines connecting memory cells in the memory cell region.

8. The semiconductor device of claim 3, wherein the first, second, third and fourth conductive lines are respectively bit lines connecting memory cells in the memory cell region.

9. A semiconductor device comprising:
   a plurality of first conductive lines extending in parallel along a first direction, having a unit width, and being adjacently separated by a gap having the unit width;
   a plurality of second conductive lines respectively extending from the plurality of first conductive lines in a second direction intersecting the first direction, having the unit width, and being adjacently separated by a gap having the unit width;
   an extension portion at least partially surrounded by the plurality of second conductive lines, having a width in the second direction greater than the gap having the unit width; and
   a plurality of pads formed in the extension portion and respectively connected to the plurality of second conductive lines.

10. The semiconductor device of claim 9, wherein the extension portion is rectangular in shape and has a first surface partially surrounded by two adjacent second conductive lines, and a second surface partially surrounded by another two adjacent second conductive lines.

11. The semiconductor device of claim 10, wherein two opposing pads in the plurality of pads are arranged symmetrically in the extension portion.

12. The semiconductor device of claim 11, wherein every four of the plurality of first conductive lines and a corresponding every four of the plurality of second conductive lines form a group including the two extension portions, a trim region in which two adjacent second conductive lines are electrically open with respect to the other two adjacent second conductive lines is arranged between the two extension portions, and the two extension portions are symmetrical to each other about the trim region.

13. The semiconductor device of claim 11, wherein every two of the plurality of pads are formed in the extension portion, and the two pads formed in one extension portion of the two extension portions are symmetrical to the other two pads formed in the other extension portion of the two extension portions about the trim region.

14. A semiconductor device comprising:

a substrate comprising a memory cell region, a connection region, and multiple groups of conductive lines arranged in parallel along a defined center line and extending in a first direction from the memory cell region into the connection region, wherein each conductive line in each group of conductive lines has a unit width and is adjacently separated from another conducive line by a gap having the unit width, wherein each group of conductive lines includes a first conductive line and a second conductive line, the first conductive line has a first length in the first direction extending away from the memory cell region that ends in a first portion extending a second length in a second direction away from the center line, the first portion terminates in a portion bending back in the first direction towards the memory cell region to connect a second portion extending in the second direction away from the center line to connect a first pad; and the second conductive line has a third length less than the first length extending in the first direction away from the memory cell region and ends in a first portion extending a fourth length less than the second length in the second direction away from the center line, the first portion terminates in a portion bending back in the first direction towards the memory cell region to connect a second portion extending in the second direction back towards the center line to connect a second pad, and a width separating the first pad from the second pad is greater than the unit width.

15. The semiconductor device of claim 14, wherein the unit width is less than a minimum width realizable by photolithography equipment used to form the conductive lines in the groups of conductive lines.

16. The semiconductor device of claim 14, wherein each group of conductive lines further includes a third conductive line and a fourth conductive line, wherein the third conductive line has a fifth length less than the third length in the first direction extending away from the memory cell region that ends in a first portion extending a sixth length less than the fourth length in a second direction away from the center line, the first portion terminates in a portion bending in the first direction away the memory cell region to connect a second portion extending in the second direction towards the center line to connect a third pad;

the fourth conductive line has a seventh length less than the fifth length extending in the first direction away from the memory cell region and ends in a first portion extending a eighth length less than the sixth length in the second direction away from the center line, the first portion terminates in a portion bending in the first direction away from the memory cell region to connect a second portion extending in the second direction away from the center line to connect a fourth pad, and a width separating the third pad from the fourth pad is greater than the unit width.

17. The semiconductor device of claim 16, wherein the first and third pads are symmetrically disposed facing each other in a trim region, and the second and fourth pads are symmetrically disposed facing each other in the trim region.

18. The semiconductor device of claim 17, wherein the respective first portions of first, second, third and fourth conductive lines are arranged in parallel and extended in the second direction towards the trim region away from the center line.

19. The semiconductor device of claim 17, wherein the first, second, third and fourth conductive lines are respectively word lines connecting memory cells in the memory cell region.

20. The semiconductor device of claim 17, wherein the first, second, third and fourth conductive lines are respectively bit lines connecting memory cells in the memory cell region.

* * * * *